(12) United States Patent  
Park et al.

(10) Patent No.: US 9,087,729 B2
(45) Date of Patent: Jul. 21, 2015

(54) SEMICONDUCTOR DEVICES INCLUDING UNITARY SUPPORTS

(71) Applicant: SAMSUNG ELECTRONICS CO., LTD., Suwon-Si, Gyeonggi-Do (KR)

(72) Inventors: Sang-Oh Park, Suwon-Si (KR); Chang-Hwan Kim, Hwaseong-Si (KR); Whan Namkoong, Seoul (KR); Jun-Young Jang, Suwon-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 14/336,334

(22) Filed: Jul. 21, 2014

(65) Prior Publication Data

US 2015/0041973 A1   Feb. 12, 2015

(30) Foreign Application Priority Data

Aug. 12, 2013 (KR) .......................... 10-2013-0095598

(51) Int. Cl.
*H01L 27/108* (2006.01)
*H01L 23/00* (2006.01)
*H01L 49/02* (2006.01)

(52) U.S. Cl.
CPC .......... *H01L 27/10814* (2013.01); *H01L 24/14* (2013.01); *H01L 27/10808* (2013.01); *H01L 27/10855* (2013.01); *H01L 28/90* (2013.01); *H01L 2224/1401* (2013.01); *H01L 2224/1405* (2013.01); *H01L 2224/1451* (2013.01); *H01L 2224/14131* (2013.01); *H01L 2224/14151* (2013.01)

(58) Field of Classification Search
CPC .... H01L 27/10814; H01L 28/90; H01L 24/14
USPC .......................................... 257/296, 298, 306
See application file for complete search history.

(56) References Cited

U.S. PATENT DOCUMENTS

| | | | |
|---|---|---|---|
| 6,496,401 B2 * | 12/2002 | Weis | ............................... 365/51 |
| 7,153,740 B2 | 12/2006 | Kim et al. | |
| 7,161,204 B2 | 1/2007 | Lin et al. | |
| 7,517,754 B2 | 4/2009 | McDaniel et al. | |
| 7,655,968 B2 | 2/2010 | Manning | |
| 7,781,297 B2 | 8/2010 | Seo | |
| 8,129,769 B2 * | 3/2012 | Kadoya | ........................ 257/296 |
| 8,399,916 B2 | 3/2013 | Kadoya | |

(Continued)

FOREIGN PATENT DOCUMENTS

| | | | |
|---|---|---|---|
| KR | 20050019500 A | 3/2005 | |
| KR | 20050075865 A | 7/2005 | |

(Continued)

*Primary Examiner* — Allan R Wilson
(74) *Attorney, Agent, or Firm* — Volentine & Whitt, PLLC

(57) ABSTRACT

A semiconductor device includes a plurality of cylindrical structures located at vertices and central points of a plurality of hexagons in a honeycomb pattern, and a unitary support having a plurality of openings. Each of the openings exposes a part each of four of the cylindrical structures. Each of the openings has the shape of a parallelogram or an oval substantially. A first distance between opposite cylindrical structures of a first pair of the four cylindrical structures exposed by each opening is shorter than a second distance between opposite cylindrical structures of a second pair of the four cylindrical structures exposed by the opening. The first distance is equal to a distance between the central point and each of the vertices of the hexagon.

20 Claims, 17 Drawing Sheets

(56) References Cited

U.S. PATENT DOCUMENTS

| | | | |
|---|---|---|---|
| 2007/0241380 A1* | 10/2007 | Hasunuma | 257/296 |
| 2008/0242042 A1 | 10/2008 | Kim et al. | |
| 2009/0233437 A1 | 9/2009 | Kim et al. | |
| 2010/0148236 A1* | 6/2010 | Kadoya | 257/306 |
| 2011/0042733 A1* | 2/2011 | Komeda et al. | 257/296 |
| 2012/0049380 A1* | 3/2012 | Kim et al. | 257/773 |
| 2012/0161283 A1* | 6/2012 | Kadoya | 257/532 |
| 2012/0235279 A1 | 9/2012 | Seo | |
| 2012/0273922 A1 | 11/2012 | Ueda | |
| 2013/0015559 A1 | 1/2013 | Lee et al. | |
| 2013/0147048 A1* | 6/2013 | Kuh et al. | 257/768 |

FOREIGN PATENT DOCUMENTS

| | | |
|---|---|---|
| KR | 10-0625395 | 9/2006 |
| KR | 20090044553 A | 5/2009 |
| KR | 10-0925032 | 10/2009 |
| KR | 201000119445 A | 11/2010 |

* cited by examiner

SEMICONDUCTOR DEVICES INCLUDING UNITARY SUPPORTS

PRIORITY STATEMENT

This application claims the benefit of Korean Patent Application No. 10-2013-0095598, filed on Aug. 12, 2013, in the Korean Intellectual Property Office, the disclosure of which is hereby incorporated by reference in its entirety.

BACKGROUND

The inventive concept relates to semiconductor devices. More particularly, the inventive concept relates to semiconductor devices including cylindrical structures having a high aspect ratio and supports for supporting the cylindrical structures as the devices are being manufactured.

As semiconductor memory devices have become more highly integrated, the "footprint" of a unit memory cell (area that the unit memory cell occupies) has been remarkably reduced and an operation voltage of the semiconductor memory devices has become relatively low. One example of such a semiconductor memory device is a dynamic random access memory (DRAM) device having cell capacitors. However, one potential drawback of scaling down a DRAM device is that the capacitance that each cell capacitor can provide may become smaller. Reductions in capacitance compromises the reliability of the DRAM devices, e.g., may lead to higher soft error rates. Thus, techniques aimed at maximizing the cell capacitance, within a given unit area, have been developed to realize highly integrated high performance DRAM devices. One of these techniques is to form cylindrical lower electrodes (e.g., cylindrical storage node electrodes), constituting the cell capacitors, with a high aspect ratio. However, cylindrical lower electrodes that have a high aspect ratio are likely to tilt or tip over during the manufacturing process and, in particular, before a dielectric layer is formed to consolidate the lower electrodes.

SUMMARY

According to an aspect of the inventive concept, there is provided a semiconductor device comprising: a two-dimensional horizontal array of cylindrical structures, the cylindrical structures being disposed at vertices and central points of a plurality of hexagons, respectively, wherein the hexagons have the pattern of a honeycomb, and a contiguous support spanning the cylindrical structures horizontally so as to support the cylindrical structures, the support having a two-dimensional horizontal array of openings therethrough, each of the openings exposing respective parts each of four of the cylindrical structures, and in which the plurality of hexagons, having the pattern of a honeycomb, include first to seventh hexagons, six vertices of the first hexagon coincide with respective ones of six central points of the second to seventh hexagons, and the central point of the first hexagon coincides with one vertex of each of the second to seventh hexagons, the shape of each of the openings as viewed from above is substantially that of a parallelogram shape or an oval, the four cylindrical structures exposed by each of the openings include a first pair of the four cylindrical structures disposed opposite one another across the opening and a second pair of the four cylindrical structures disposed opposite one another across the opening, the cylindrical structures of the first pair are spaced from another by a first distance, the cylindrical structures of the second pair are spaced from one another by a second distance, the first distance is shorter than the second distance, and the first distance is equal to the distances between the central point of each hexagon and the vertices of that hexagon.

According to another aspect of the inventive concept, there is provided a semiconductor device, comprising: a plurality of cylindrical structures, and a contiguous support spanning the cylindrical structures, and in which the cylindrical structures are disposed at vertices and central points of a plurality of hexagons in the pattern of a honeycomb, the plurality of hexagons including first to seventh hexagons, the six vertices of the first hexagon coinciding with six central points of the second to seventh hexagons, respectively, and a central point of the first hexagon coinciding with a respective one of the vertices of each of the second to seventh hexagons, in which the support spans the cylindrical structures horizontally to support the cylindrical structures and has a plurality of openings extending vertically therethrough, the shape of each of the openings as viewed from above being substantially that of a parallelogram shape or an oval, and each of the openings exposing respective parts each of four of the cylindrical structures, and in which the unitary support has an open ratio of about 65% or higher, wherein the open ratio of the unitary support is the ratio of an equivalent number of entire ones of the cylindrical structures exposed by the open regions in a unit area to an equivalent number of entire ones of the cylindrical structures located in the unit area, with the unit area being the area of a tetragon whose four vertices each coincide with a central point of a respective one of four adjacent ones of the openings.

According to still another aspect of the inventive concept, there is provided a semiconductor device comprising: a substrate, a horizontal array of cylindrical structures each extending vertically on the substrate, and a support disposed above the substrate, and in which the horizontal array of cylindrical structures consists of a plurality of columns of cylindrical structures, and a plurality of rows of cylindrical structures each crossing a plurality of the columns of the cylindrical structures, the cylindrical structures in each row thereof being spaced uniformly apart from one another, the cylindrical structures in each column thereof being spaced uniformly apart from one another, and the cylindrical structures being disposed at vertices and geometrical centers of a plurality of regular hexagons, respectively, and wherein the hexagons have the pattern of a honeycomb, in which the support is contiguous with at least a part of each of the cylindrical structures so as to support the cylindrical structures, the support having a horizontal array of openings comprising a plurality of columns of openings, and a plurality of rows of openings each crossing a plurality of the columns of the openings, the openings in each row thereof being spaced uniformly apart from one another, the openings in each column thereof being spaced uniformly apart from one another, each of the openings extending vertically through the support, in which part of each of the openings intersects only four of the cylindrical structures and at respective sides thereof, in which the plurality of hexagons include first to seventh hexagons, and in which six vertices of the first hexagon coincide with the geometrical centers of the second to seventh hexagons, respectively, and the geometrical center of the first hexagon coincides with one vertex of each of the second to seventh hexagons.

BRIEF DESCRIPTION OF THE DRAWINGS

Preferred embodiments of the inventive concept will be described in more detail with reference to the accompanying drawings in which.

DETAILED DESCRIPTION OF THE PREFERRED EMBODIMENTS

Figure 1:
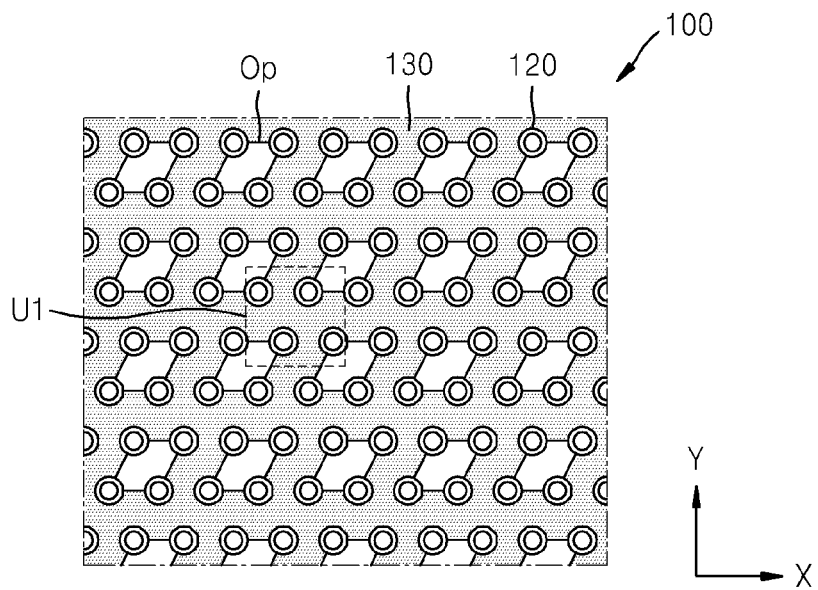
FIG. 1 is a plan view of a support of semiconductor devices according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "connected to" another element or layer, it can be directly on or directly connected to the other element or layer or intervening elements or layers may be present. In contrast, when an element or layer is referred to as being "directly on" or "directly connected to" another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes. The shapes of elements or features as described will generally refer to the shapes of the elements/features as viewed from above or in plan. The term "adjacent" will generally refer to a group of elements circumscribing a region that does not include any other of the same type of element. The term "two-dimensional array" will generally describe elements/features laid out in rows and columns that intersect each other at an angle.

A semiconductor device 100 according to the inventive concept will now be described in detail with reference to FIG. 1.

Figure 12A:
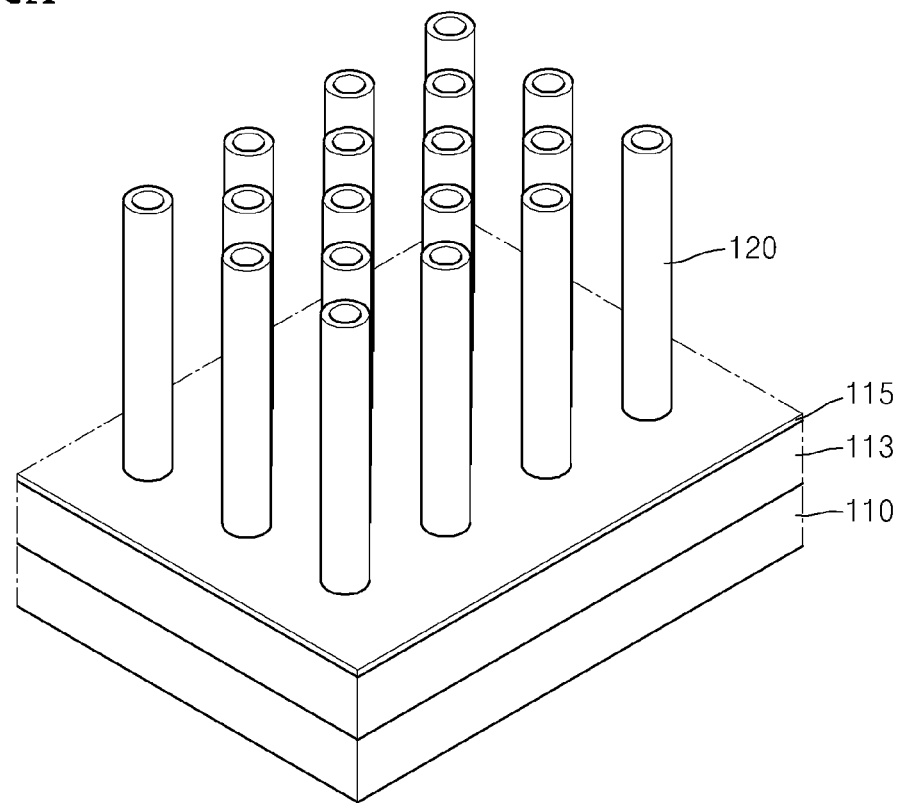
FIG. 12A is a perspective view of an array of cylindrical structures of a semiconductor device according to the inventive concept.
Figure 13A:
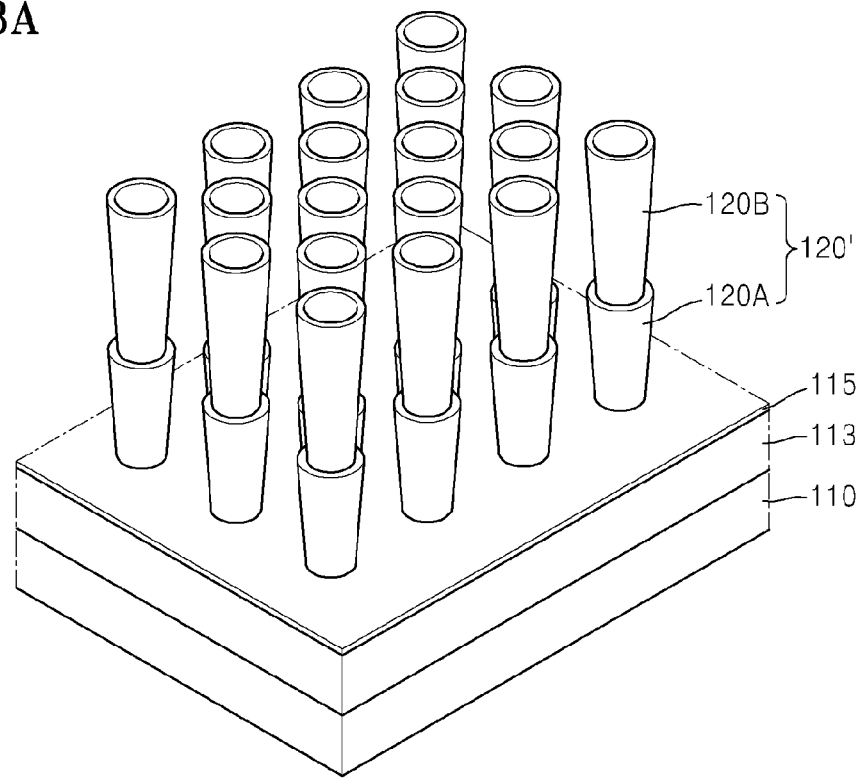
FIG. 13A is a perspective view of another array of cylindrical structures of a semiconductor device according to the inventive concept.

Referring to FIG. 1, the semiconductor device 100 may include a plurality of charge storage elements, for example, a plurality of capacitors. Each of the capacitors may include a storage node electrode 120, that is, a lower electrode, and the lower electrode 120 may comprise a cylindrical structure that maximizes a capacitance value of the capacitor. In this respect, the lower electrode 120 may be consist of a cylindrical structure, as illustrated in FIG. 12A. Alternatively, the lower electrode 120 may include a cylindrical upper portion 120B and a pillar-shaped lower portion 120A located under the cylindrical lower portion 120B, as illustrated in FIG. 13A.

The plurality of lower electrodes 120 may be two dimensionally arrayed along a first direction parallel with an X-axis and along a second direction parallel with a Y-axis. Accordingly, the lower electrodes 120 may be arrayed in rows and columns. Moreover, the lower electrodes 120 arrayed in two adjacent rows may be disposed in a zigzag fashion along the first direction in a plan view. That is, all the X-axis coordinates of the lower electrodes 120 arrayed in two adjacent rows may be different from each other. As a result, the distance between the lower electrodes 120 is maximized. Accordingly, a dielectric layer may be uniformly deposited on the lower electrodes 120.

Moreover, each respective group of seven of the lower electrodes 120 may be disposed on six vertices of a respective hexagon and on a central point of the hexagon, and wherein the hexagons together have the form of a honeycomb. Descriptions of the lower electrodes 120 arranged in this form of a honeycomb will be described in more detail with reference to FIG. 2.

Furthermore, the cylindrical lower electrodes 120 may have a high aspect ratio. For example, each of the cylindrical lower electrodes 120 may have an aspect ratio of about 10 to about 30. Examples of high aspect ratios in this embodiment are when the outer diameter of (width in direction X or Y) of each cylindrical lower electrode 120 is within a range of about 20 nanometers to about 100 nanometers and the height of each cylindrical lower electrode 120 is within a range of about 500 nanometers to about 4000 nanometers. However, the cylindrical lower electrodes 120 are not be limited to having outer diameters and heights within these ranges.

The semiconductor device 100 also employs a support 130 for the cylindrical lower electrodes 120, which is especially advantageous in the case in which the cylindrical lower electrodes 120 have a high aspect ratio. Otherwise, the cylindrical lower electrodes 120 may lean or tilt as the device 100 is being manufactured and may even become broken.

The support 130 may have a unitary or otherwise contiguous structure defining openings extending vertically therethrough. For example, the support 130 may consist of a plate of material having an array of regularly spaced of openings extending vertically therethrough. Hereinafter, the term open regions Op will be used to refer to such openings in the support 130.

Figure 14:
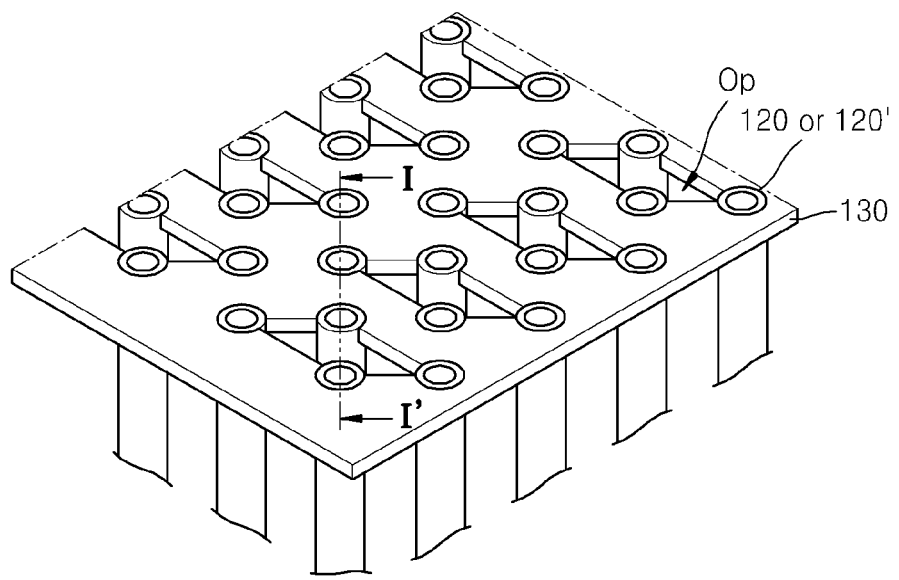
FIG. 14 is a perspective view of cylindrical structures and a support of a semiconductor device according to the inventive concept.

Each of the open regions Op may expose four respective ones of adjacent lower electrodes 120. Here, the term "adjacent" will refer to the fact that no lower electrode 120 is interposed between any two of the four electrodes 120. As will be described in more detail later on, portions of each of the lower electrodes 120 are exposed by the open regions Op before a dielectric layer 150 (see FIG. 15F or 16F) is deposited to cover the lower electrodes 120. Accordingly, the lower electrodes 120 are not exposed by the open regions Op once the dielectric layer 150 and an upper electrode 160 (see FIG. 15F or 16F) have been formed on the lower electrodes 120. The support 130 may contact sidewalls of top end portions of the lower electrodes 120, as illustrated in FIG. 14. Thus, the support 130 may support the lower electrodes 120 so that the lower electrodes 120 do not tilt after they have been formed. Also, the support 130 may expose top surfaces of the lower electrodes 120, as illustrated in FIG. 14.

A certain amount of a sidewall of each lower electrode 120 is exposed by a respective one of the open regions Op when viewed in plan. The exposed amount of the sidewall of each lower electrode 120 refers to the ratio of the measure in the circumferential direction of the exposed portion of the lower electrode 120 to the circumference of the lower electrode 120. For example, in the embodiment illustrated in FIG. 1, about one fourth of the sidewall of each lower electrode 120 is exposed by one of the open regions Op when viewed in plan. However, the amount of the sidewall of each lower electrode 120 exposed may vary according to the shape of the open regions Op.

Furthermore, the support 130 has an "open ratio" that depends on the shape and arrangement of the open regions Op of the support. The open ratio of the support 130 is defined as the ratio of the number of the lower electrodes 120 exposed by the open regions Op in a unit area to the number of the lower electrodes 120 in the unit area. For example, when an area defined by a tetragon whose vertices coincide with four central points of four adjacent open regions Op as corresponds to a first unit area U1 as illustrated in FIG. 1, four lower electrodes 120 are located in the first unit area U1 and all the four lower electrodes 120 in the first unit area U1 are exposed by the open regions Op. Thus, in this example, the open ratio of the support 130 shown in FIG. 1 is 100%.

The larger the open ratio of the support 130, the more uniform and conformal a dielectric layer formed on the lower electrodes 120 can be. In contrast, the smaller the open ratio of the support 130, the longer it takes to form a dielectric layer on the lower electrodes 120 and the less uniform the dielectric layer will be (or the less step coverage will be realized). That is, if too few lower electrodes 120 are exposed by the open regions Op, a deposition process of forming a dielectric layer on the lower electrodes 120 may be performed unstably, resulting in non-uniformity in the dielectric layer which in turn may cause the semiconductor device 100 to malfunction or degrade the performance of the semiconductor device 100.

The support 130 of the semiconductor device 100 as described above has a large open ratio, which makes it easy to perform processes subsequent to the process of forming the lower electrodes 120. Thus, high performance semiconductor devices may be realized. In addition, minimal portions of the top ends of the lower electrodes 120 are sacrificed to this end and hence, the capacitors of the semiconductor device 100 still offer high performance, i.e., may provide relatively large capacitance values. As a result, high performance semiconductor devices may be realized.

Figure 2:
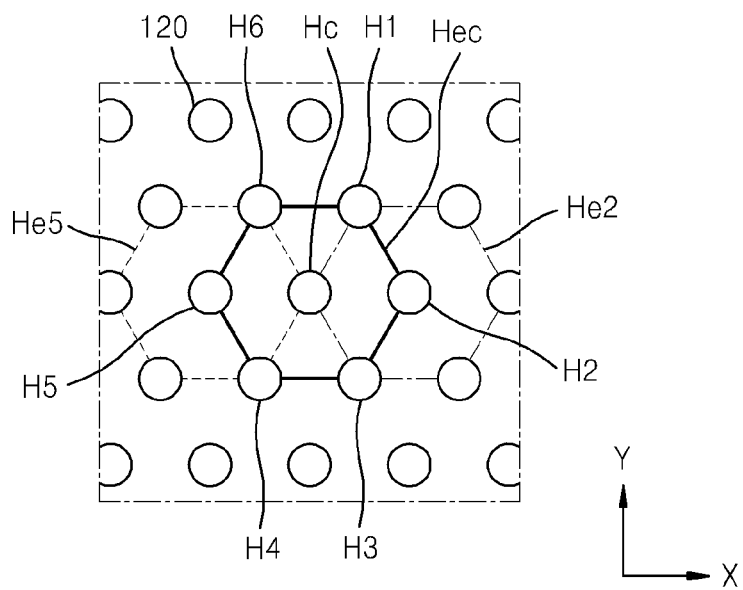
FIG. 2 is a schematic diagram of an array of cylindrical structures of semiconductor devices according to the inventive concept.

FIG. 2 illustrates an aspect of an array of the cylindrical structures of a semiconductor device according to the inventive concept.

Referring to FIG. 2, the cylindrical structures of the semiconductor device, for example, the lower electrodes (120 of FIG. 1), may be laid out in the form of a honeycomb when viewed in plan. In this example, the lower electrodes 120 of a group of seven of the lower electrodes 120 are disposed at six vertices H1, H2, H3, H4, H5 and H6 of a hexagon constituting a cell of a honeycomb-shaped pattern and at a central point Hc of the hexagon. Such a grouping of the lower electrodes 120 is repeated in the first direction parallel with the X-axis and in the second direction parallel with the Y-axis with spacing such that adjacent hexagons in the direction of the X-axis overlap, whereas sides of adjacent hexagons in the direction of the Y-axis coincide.

More specifically with respect to adjacent ones of the hexagons in the direction the X-axis, first to sixth vertices H1, H2, H3, H4, H5 and H6 of a central hexagon Hec (indicated in solid lines) may correspond to respective ones of central points of six hexagons disposed adjacent to the central hexagon Hec, and wherein the six hexagons adjacent to the central hexagon Hec each have one vertex that coincides with a central point Hc of the central hexagon Hec. For example, the second vertex H2 of the central hexagon Hec may correspond to a central point of a second hexagon He2 (indicated in alternate long and short dash lines), and the fifth vertex H5 of the central hexagon Hec may correspond to a central point of a fifth hexagon He5 (indicated in dotted lines). Furthermore, the central point Hc of the central hexagon Hec may correspond to a vertex that the second and fifth hexagons He2 and He5 share with each other.

Each of the hexagons Hec, He2 and He5 may be a regular hexagon. In addition, each of six triangles sharing the central point Hc of the central hexagon Hec may be a regular triangle. Thus, distances between adjacent vertices of a single hexagon may be equal to a distance between each vertex and a central point of the single hexagon.

In this example in which the lower electrodes 120 are laid out in a specific pattern similar to that of a honeycomb, the lower electrodes 120 are spaced apart from each other by the equal distances. Thus, a dielectric layer and an upper electrode can be formed uniformly on the lower electrodes 120 to provide a plurality of uniform capacitors constituting a high performance semiconductor device.

In FIG. 2 (and FIGS. 3 to 11 that follow), each of the lower electrodes 120 is illustrated as having a circular cross section. However, the lower electrodes 120 shown in FIG. 2 (and FIGS. 3-11) may have a cylindrical shape, i.e., may have an annular cross section as shown in and described with reference to FIG. 1. Actually, each of the lower electrodes 120 may have any of the shapes illustrated in FIGS. 12A to 16F.

Figure 3:
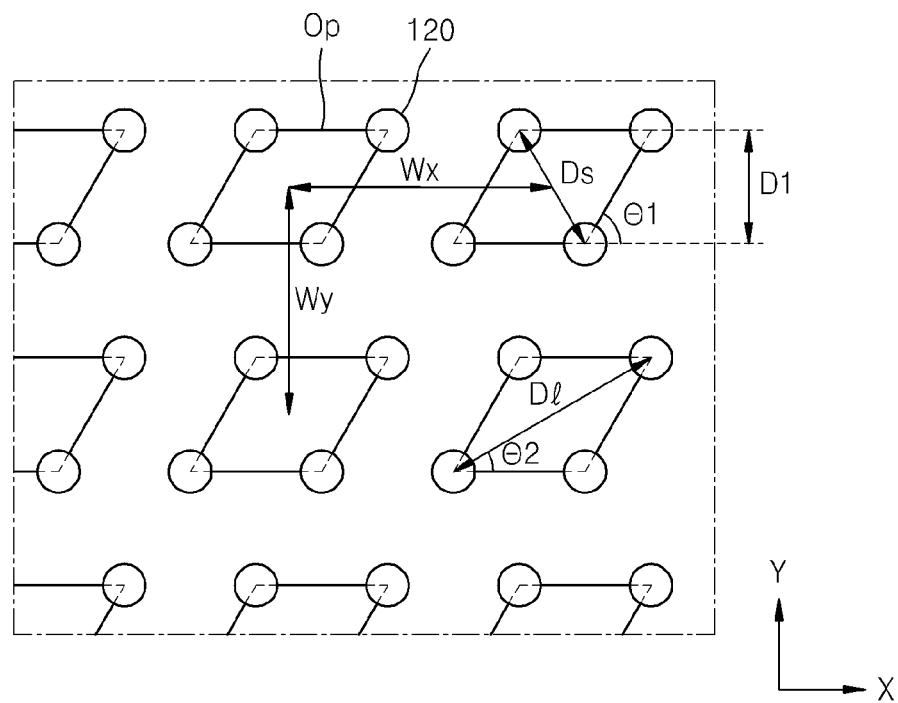
FIG. 3 is a schematic diagram of open regions in the support shown in FIG. 1.

FIG. 3 is illustrates in more detail the open regions Op of the support 130 shown in FIG. 1.

Referring to FIG. 3, as described above, the cylindrical lower electrodes 120 may be disposed in a pattern similar to that of a honeycomb and the unitary support 130 may be contiguous as between the lower electrodes 120 to prevent the lower electrodes 120 from tilting after they have been formed. Furthermore, the unitary support 130 may include a plurality of open regions Op, each of which exposes four lower electrodes 120.

Each of the open regions Op may have boundaries corresponding to that of a parallelogram, e.g., a diamond, whose vertices coincide with four central points of four adjacent lower electrodes 120. In the illustrated example, each of the open regions Op may be substantially that of a diamond because the support 130 contacts outer sidewalls of the lower electrodes 120. Dotted lines are illustrated in FIG. 3 to show the vertices of the diamond shape but it is noted that the open regions Op do not extend into the lower electrodes 120 where these dotted lines are shown. In this case, therefore, the term "substantially" is used to discount the portion of the diamond occupied by the four lower electrodes 120, i.e., to take into account that portions of the lower electrodes 120 can be considered as protruding into the diamond-shaped open region Op. Moreover, the shapes of the open regions Op is not limited to being substantially that of a parallelogram with the lower electrodes being disposed at the vertices of the parallelogram. Various other shapes of the open regions Op and their relation to the exposed set of four lower electrodes 120 will be described in detail later on with reference to FIGS. 4A to 4C.

Also, in the example illustrated in FIG. 3, the length Ds of a minor axis of each open region Op may be 3.0 times "F", and the length D1 of a major axis of each open region Op may be 5.2 times "F". The value represented by "F" is that of a minimum feature size (MFS) that can be achieved in the lithography process used to form the open regions Op. A distance D1 between two adjacent rows in which the lower electrodes 120 are arrayed may be 2.6 times "F". The minor axis of each of the open regions Op may correspond to the minor axis of an oval, along which the lower electrodes 120 are disposed as spaced uniformly from each other, and the major axis of each of the open regions Op may correspond to the major axis of the oval. Alternatively, the minor axis of each of the open regions Op may correspond to the minor diagonal of a parallelogram, along which the lower electrodes 120 are disposed as spaced uniformly from each other, and the major axis of each of the open regions Op may correspond to the major (longer) diagonal of the parallelogram.

In the present embodiment in which the lower electrodes 120 are arrayed in a pattern similar to that of a honeycomb, the length D1 of the major axis of each open region Op is twice the distance D1 between two adjacent rows. Furthermore, if each of the open regions Op is cut along the minor axis thereof, two regular triangles may be provided and an internal angle θ1 of each regular triangle may be 60 degrees. Thus, an angle θ2 between the major axis of the open region Op and the X-axis parallel with the first direction may be 30 degrees.

The open regions Op in FIG. 3 may also be regularly arrayed, as was mentioned above with reference to FIG. 1. In an example of this embodiment, the pitch Wx of the open regions Op in the first direction is 6.0 times "F" and the pitch of the open regions Op in the second direction is 5.2 times "F". The pitch Wx refers to the distance between central points of two adjacent open regions Op disposed in the first direction (parallel with the X-axis), and the pitch Wy refers to the distance between central points of two adjacent open regions Op disposed in the second direction (parallel with the Y-axis). Thus, the pitch Wy may be twice the distance D1 between two adjacent rows. That is, the pitch Wy may be 5.2 times "F". Furthermore, since a distance between two adjacent lower electrodes 120 arrayed in the first direction is 3.0 times "F", the pitch Wx may be twice the distance between two adjacent lower electrodes 120 in the first direction. That is, the pitch Wx may be 6.0 times "F".

Figure 4A:
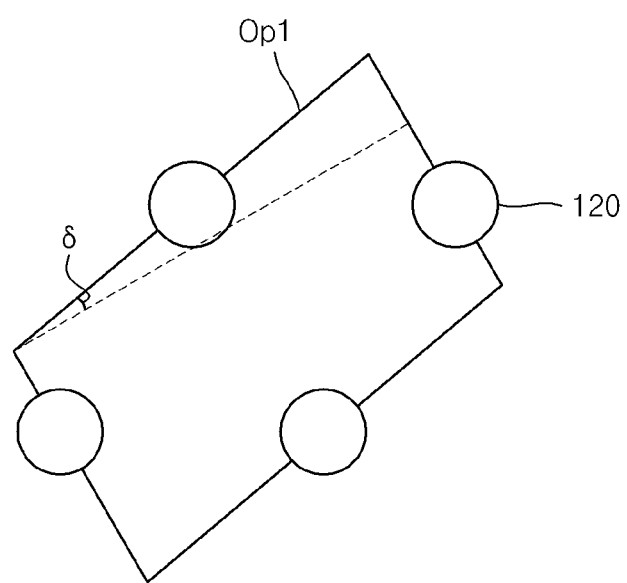
FIGS. 4A, 4B and 4C are schematic diagrams of various alternative versions of the open regions in the support shown in FIG. 1.
Figure 4B:
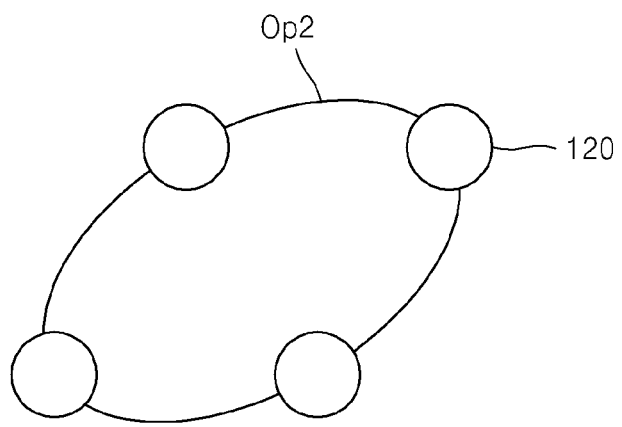
Figure 4C:
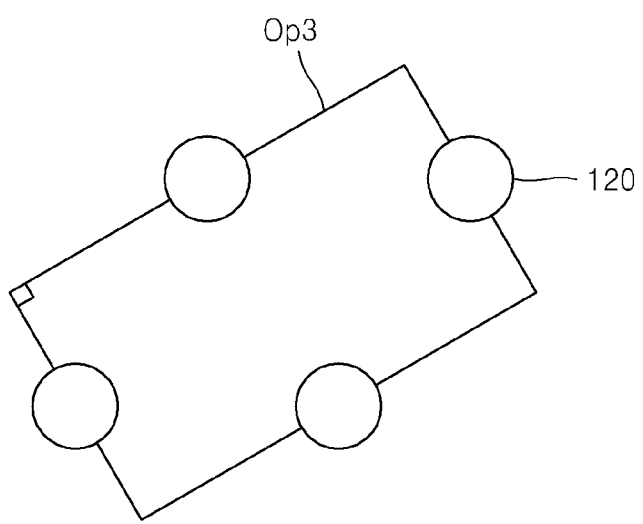

FIGS. 4A, 4B and 4C illustrate other versions of the open regions of a support 130 of the semiconductor device 100.

Referring to FIG. 4A, each of the open regions Op substantially has the shape of a parallelogram. In this example, four lower electrodes 120 are disposed along the four sides of the parallelogram, respectively. Thus, a respective pair of the lower electrodes 120 is exposed at each pair of opposite sides of the open region Op1. Furthermore, about half of the sidewall of each lower electrode 120 is exposed by an open region Op1, as illustrated in the plan view of FIG. 4A.

Each of two opposite lower electrodes 120 may be disposed at the center of one of two opposite long sides of the parallelogram defining the open region Op1. In contrast, with respect to the vertices at the ends of the short sides of the parallelogram defining the open region Op1, each of the other two opposite lower electrodes 120 may be disposed closer to one vertex of the than the other. In addition, two opposite short sides of the parallelogram defining the open region Op1 may be parallel with a straight line that connects the lower electrodes 120 disposed along the two opposite long sides of the parallelogram. However, the two opposite long sides of the parallelogram defining the open region Op1 may be non-parallel with a straight line that connects the lower electrodes 120 disposed along the two opposite short sides of the parallelogram. Accordingly, one of the long sides of the parallelogram defining the open region Op1 may intersect a straight line connecting the electrodes 120 disposed along the two opposite short sides of the parallelogram at a predetermined angle δ.

Also, comparing this example to the example of FIG. 1, the length of each of the two opposite short sides of the parallelogram defining the open region Op1 may be equal to the length of the minor axis (i.e., the short diagonal line) of the diamond-shaped open region Op in FIG. 1. That is, the length of each of the opposite short sides of the parallelogram defining the open region Op1 may be 3.0 times "F".

Also, the length of the two opposite long sides of the parallelogram defining the open region Op1 may be greater than the length of the major axis (i.e., the long diagonal) of the diamond-shaped open region Op shown in FIG. 1. If the angle δ between the long side of the parallelogram defined by the open region Op1 and the straight line connecting the electrodes 120 disposed along the two opposite short sides of the parallelogram increases, a difference between the length of the major axis of the diamond-shaped open region Op shown in FIG. 1 and the length of the long side of the parallelogram defined by the open region Op1 may also increase. However, the angle δ may be less than a predetermined angle because of the nature of the honeycomb pattern. For example, when the angle δ is approximately 30 degrees, the two opposite long sides of the parallelogram defined by the open region Op1 may be approximately equal to two opposite lines of the four sides of the diamond-shaped open region Op shown in FIG. 1. Accordingly, the location of a vertex at the end of the short side may approach another lower electrode 120 adjacent to the open region Op. In such a case, the support can not include open regions which expose four lower electrodes 120 each.

Referring to FIG. 4B, the open regions Op2 of the support 130 of the semiconductor device 100 may substantially have the shape of an oval. The minor axis of the oval open region Op2 may have a length of about 3.0 times "F" and the major axis of the oval open region Op2 may have a length of about 5.2 times "F", like the diamond-shaped open region Op in the example of FIG. 1. The minor axis of the diamond-shaped open region Op may correspond to the short diagonal and the major axis of the diamond-shaped open region Op may correspond to the long diagonal, as described above.

Referring to FIG. 4C, the open regions Op3 of the support 130 of the semiconductor device 100 may be substantially rectangular. In this case, four lower electrodes 120 may be disposed at respective central points of the four sides of the rectangular open region Op3, respectively. Furthermore, half of the sidewall of each lower electrode 120 may be exposed by the rectangular open region Op3 in a plan view, as illustrated of FIG. 4C.

Furthermore, if the length of each of two opposite short sides of the rectangular open region Op3 is equal to the length of the minor axis (i.e., the short diagonal) of the diamond-shaped open region Op shown in FIG. 1, and the length of each of the two opposite long sides of the rectangular open region Op3 is equal to the length of the major axis (i.e., the long diagonal) of the diamond-shaped open region Op shown in FIG. 1, the length of each of the two opposite short sides of the rectangular open region Op3 will be 3.0 times "F", and the length of each of the two opposite long sides of the rectangular open region Op3 will be 5.2 times "F".

FIGS. 5 to 11 illustrate various supports of other embodiments of semiconductor devices according to the inventive concept.

Figure 5:
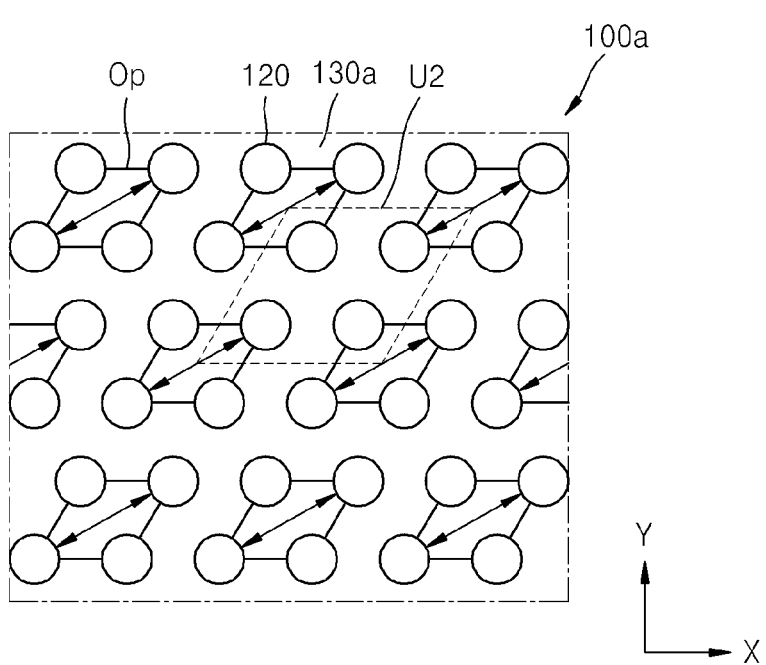
FIGS. 5, 6, 7, 8, 9, 10 and 11 are plan views of respective supports of semiconductor devices according to the inventive concept.

Referring to FIG. 5, each of open regions Op of a support 130a constituting a semiconductor device 100a may have the same shapes as those of the open regions Op of the support 130 of the embodiment illustrated in FIG. 1. That is, the shape of each of the open regions Op illustrated in FIG. 5 may also be substantially that of a diamond in a plan view. Alternatively, though, the open regions Op of the embodiment of FIG. 5 may have any of the shapes described with reference to FIGS. 4A, 4B and 4C. Likewise, although FIGS. 6 to 11 illustrate supports 130b, 130c, 130d, 130e, 130f and 130g including diamond-shaped open regions Op, the open regions Op of supports of the embodiments of FIGS. 6 to 11 may also have any of the shapes described with reference to FIGS. 4A, 4B and 4C.

In contrast to the open regions Op of the support 130 of the embodiment of FIG. 1, in the embodiment of the semiconductor device 100a of FIG. 5, the open regions Op in two adjacent rows thereof are disposed in a zigzag fashion along the first direction when viewed in plan. That is, the X-axis coordinates of the central points of all the open regions Op in two adjacent rows thereof are different from each other.

Furthermore, as shown in FIG. 5, an area surrounded by a parallelogram whose vertices coincide with four central points of four adjacent open regions Op is a second unit area U2, four lower electrodes 120 are located in the second unit area U2, and all four of the lower electrodes 120 in the second unit area U2 are exposed by the open region Op. Thus, the "open ratio" of the support 130a shown in FIG. 5 is 100%.

In the semiconductor devices 100 and 100a shown in FIGS. 1 and 5, all the major axes (e.g., the long diagonals) of the open regions Op are parallel. Also, all the major axes of the open regions Op of the semiconductor device 100 or 100a intersect the X-axis at an angle, e.g., 30 degrees.

Figure 6:
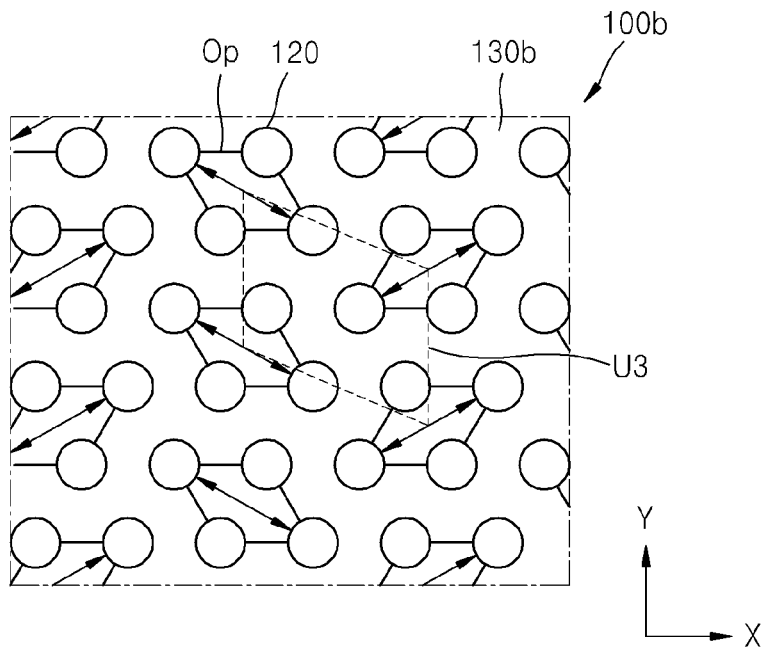

In the embodiment of a semiconductor device 100b of FIG. 6, as distinguished from the embodiments of FIGS. 1 and 5, not all of the major axes (e.g., the long diagonals) of the open regions Op are parallel. Specifically, the major axes of the open regions Op arrayed in the even-numbered columns may intersect the X-axis at an angle of negative 30 degrees whereas the major axes of the open regions Op arrayed in the odd-numbered columns may intersect the X-axis at an angle of positive 30 degrees. Accordingly, the major axes of the open regions Op arrayed in the even-numbered columns may intersect the major axes of the open regions Op arrayed in the odd-numbered columns at an angle of 60 degrees.

According to the present embodiment, the open regions Op arrayed in two adjacent columns are disposed in a zigzag fashion along the second direction when viewed in plan. That is, the Y-axis coordinates of the central points of all the open regions Op arrayed in two adjacent columns are different from each other.

The support 130b of the semiconductor device 100b in the embodiment of FIG. 6 may have an open ratio of 100%. That is, when an area surrounded by a parallelogram whose vertices coincide with four central points of four adjacent open regions Op defines a third unit area U3 as illustrated in FIG. 6, (the equivalent of) four lower electrodes 120 in the third unit area U3 are exposed by the open regions Op, and (the equivalent of) four lower electrodes 120 are located in the third unit area U3.

More specifically, as is illustrated in FIG. 6, three lower electrodes 120 may be completely located in the third unit area U3, and two lower electrodes 120 may be partially located in the third unit area U3. However, the sum of horizontal cross-sectional areas (complete and partial) located in the third unit area U3, of the five lower electrodes 120, is equal to four times the entire horizontal cross-sectional area of a single lower electrode 120. Thus, the open ratio of the support 130b is 100%.

In the embodiments of the semiconductor devices 100, 100a and 100b of FIGS. 1, 5 and 6, none of the major axes (e.g., the long diagonals) of the open regions Op are perpendicular to the X-axis.

Figure 7:
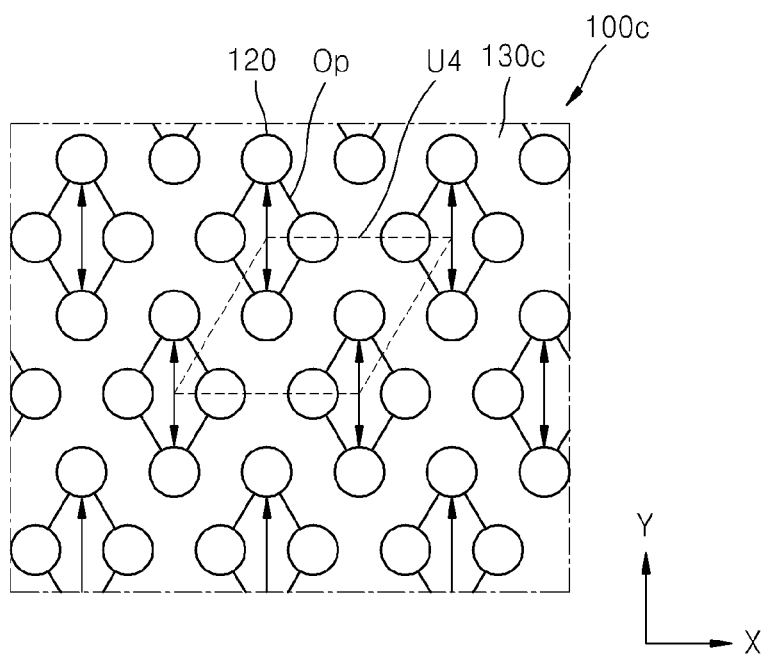

However, in the embodiment of a semiconductor device 100c of FIG. 7, all the major axes (e.g., the long diagonals) of the open regions Op are perpendicular to the X-axis. That is, all the major axes of the open regions Op of the support 130c are parallel with the Y-axis.

Furthermore, in the embodiment of FIG. 7, the open regions Op arrayed in two adjacent rows are disposed in a zigzag fashion along the first direction when viewed in plan. That is, the X-axis coordinates of the central points of all the open regions Op arrayed in two adjacent rows are different from each other.

The support 130c of the semiconductor device 100c may have an open ratio of 100%. That is, when an area surrounded by a parallelogram whose vertices coincide with four central points of four adjacent open regions Op defines a fourth unit area U4 as illustrated in FIG. 7, the equivalent of four lower electrodes 120 in the fourth unit area U4 are exposed by the open regions Op, and the equivalent of four entire lower electrodes 120 are located in the fourth unit area U4.

More specifically, although the actual number of the lower electrodes 120 completely and partially located in the fourth unit area U4 is not four, the sum of horizontal cross-cross sectional areas (complete and partial) located in the fourth unit area U4, of the lower electrodes 120, may be equal to four times the entire horizontal cross-sectional area of a single lower electrode 120. In this case, the open ratio of the support 130c is 100%.

Figure 8:
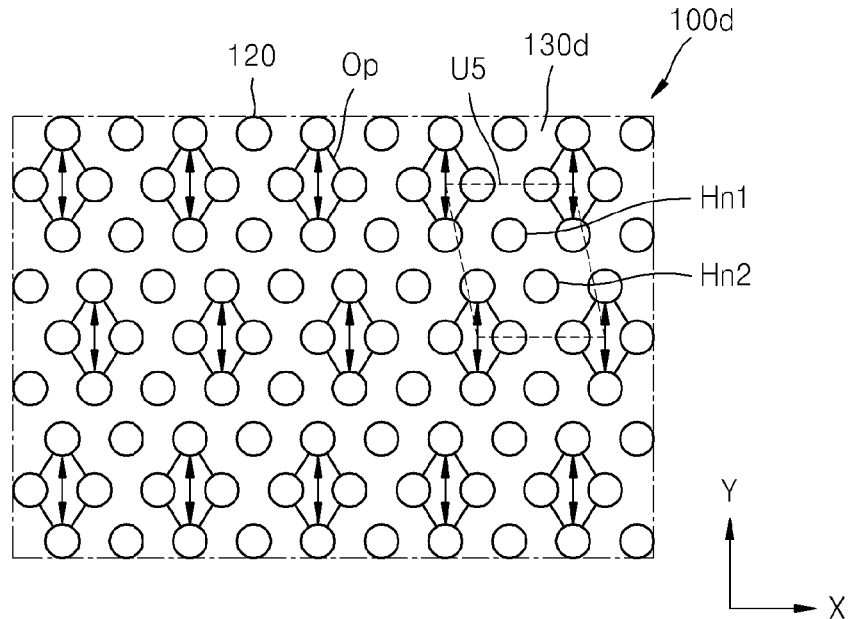

FIG. 8 illustrates still another embodiment of a semiconductor device 100d, having a support 130d, according to the inventive concept. In this embodiment, the open ratio of the support 130d is less than 100%.

For example, major axes of the open regions Op of the support 130d may be perpendicular to the X-axis, like the open regions Op of the support 130c shown in FIG. 7. That is, the major axes of the open regions Op of the support 130d may be parallel with the second direction. Furthermore, the open regions Op arrayed in two adjacent rows may be disposed in a zigzag fashion along the first direction when viewed in plan. That is, the X-axis coordinates of the central points of all the open regions Op arrayed in two adjacent rows may be different from each other.

Also, the support 130d of the semiconductor device 100d may have an open ratio of 67%. That is, an area surrounded by a parallelogram whose vertices coincide with four central points of four adjacent open regions Op as four vertices defines a fifth unit area U5 as illustrated in FIG. 8, the equivalent of four lower electrodes 120 in the fifth unit area U5 are exposed by the open regions Op (two entire lower electrodes 120 and a half each of four lower electrodes 120), and the equivalent of six lower electrodes 120 are located in the fifth unit area U5.

More specifically, six of the lower electrodes 120 located in the fifth unit area U5 are exposed by the open regions Op. However, the sum of the horizontal cross-cross sectional areas actually located in the fifth unit area U5, of these six lower electrodes 120, is equal to four times the entire horizontal cross-sectional area of a single lower electrode 120. Thus, the equivalent of four lower electrodes 120 in the fifth unit area U5 are exposed by the (four) open regions Op. Furthermore, two lower electrodes Hn1 and Hn2, completely located in the fifth unit area U5, are not exposed at all by the open regions Op. Thus, there is the equivalent of six lower electrodes 120 in the fifth unit area U5.

Figure 9:
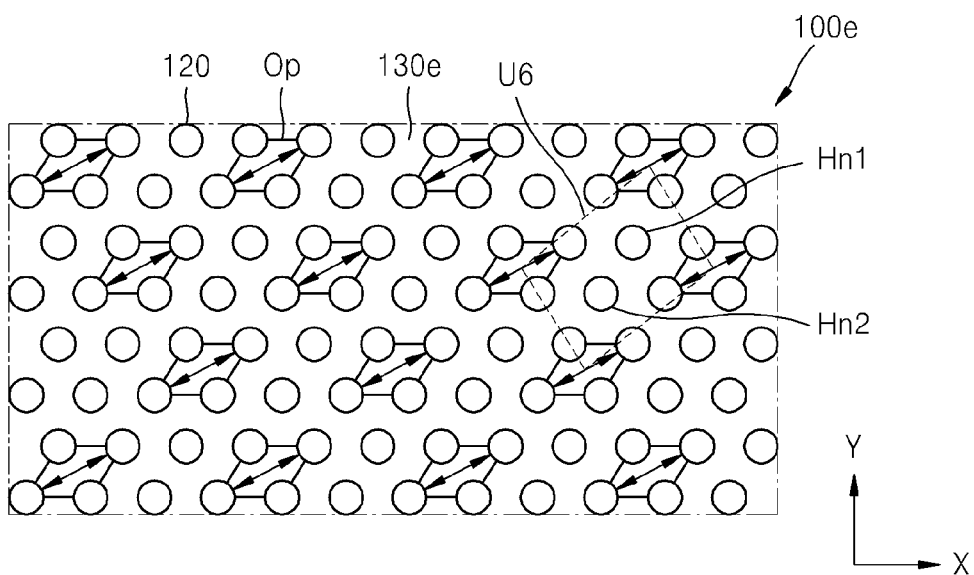

FIG. 9 illustrates another embodiment of a semiconductor device 100e in which the open ratio of its support 130e is less than 100%, e.g., is 67% like that of the support 130d of the embodiment of FIG. 8.

That is, an area surrounded by a parallelogram whose vertices coincide with four central points of four adjacent open regions Op defines a sixth unit area U6, the equivalent of four lower electrodes 120 in the sixth unit area U6 are exposed by four open regions Op, and the equivalent of six lower electrodes 120 are located in the sixth unit area U6.

Furthermore, in this embodiment, the open regions Op of the support 130e may be arrayed such that major axes of the open regions Op of the support 130e are parallel similar to the support 130a shown in FIG. 5. For example, the major axes of the open regions Op of the support 130e may intersect the X-axis at an angle of 30 degrees. Furthermore, in the present embodiment, the open regions Op arrayed in two adjacent rows may be disposed in a zigzag fashion along the first direction when viewed in plan. That is, the X-axis coordinates of the central points of all the open regions Op arrayed in two adjacent rows may be different from each other.

Figure 10:
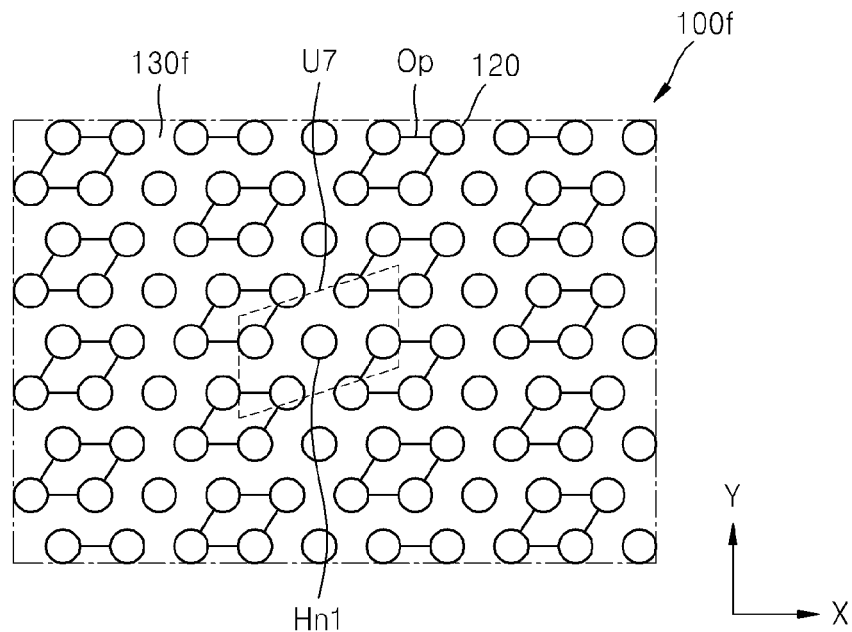

FIG. 10 illustrates another embodiment a semiconductor device 100f whose support 130f has an open ratio of less than 100%.

In particular, the support 130f of the semiconductor device 100f according to the present embodiment has an open ratio of 80%. More specifically, an area surrounded by a parallelogram whose vertices coincide with four central points of four adjacent open regions Op defines a seventh unit area U7 as illustrated in FIG. 10. Three lower electrodes 120 are completely located in the seventh unit area U7, and four lower electrodes 120 are partially located in the seventh unit area U7. Furthermore, in this case, one lower electrode Hn1 among the three lower electrodes 120 completely located in the seventh unit area U7 is not exposed by the open region Op. However, two of the three lower electrodes 120 completely located in the seventh unit area U7 and all four of the lower electrodes 120 partially located in the seventh unit area U7 are exposed by the open regions Op. The sum of the horizontal cross-cross sectional areas located in the seventh unit area U7, of the four lower electrodes 120 partially located in that area U7, is equal to twice an entire horizontal cross-sectional area of a single lower electrode 120.

Thus, the equivalent of four lower electrodes 120 in the seventh unit area U7 are exposed by the open regions Op, and the equivalent of five lower electrodes 120 are located in the seventh unit area U7. Thus, the open ratio of the support 130f is 4/5 or 80%.

Also, in this embodiment, the major axes of the open regions Op of the support 130f are all parallel and may intersect the X-axis at an angle of, for example, 30 degrees. Furthermore, the open regions Op arrayed in two adjacent columns may be disposed in a zigzag fashion along the second direction when viewed in plan. That is, the Y-axis coordinates of the central points of all the open regions Op arrayed in two adjacent columns may be different from each other.

Figure 11:
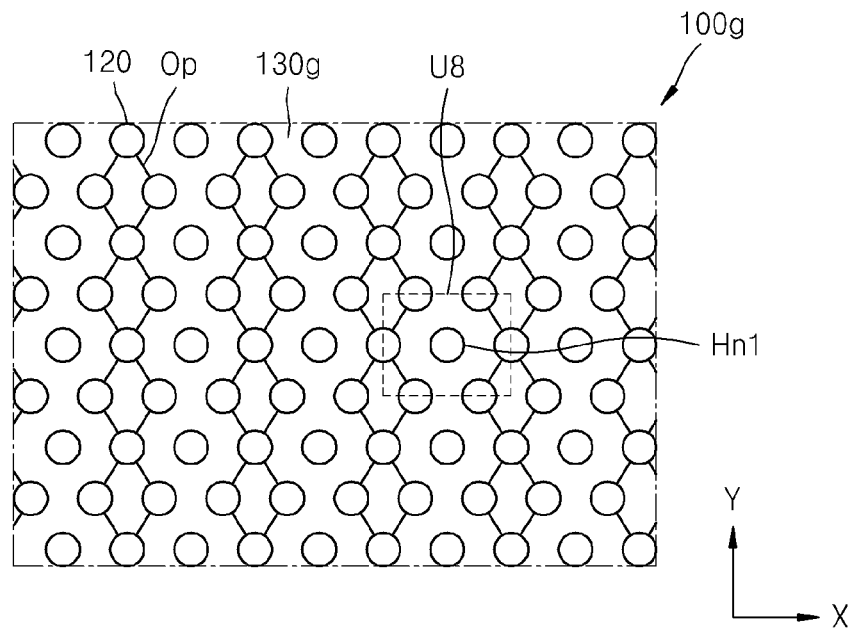

FIG. 11 illustrates another embodiment of a semiconductor device 100g, according to the inventive concept, whose support 130g has an open ratio of less than 100%.

In this embodiment, the major axes of the open regions Op of the support 130g may be parallel with the second direction (i.e., the Y-axis). Furthermore, the open regions Op of the support 130g may be two-dimensionally arrayed in rows and columns.

An area surrounded by a parallelogram whose vertices coincide with four central points of four adjacent open regions Op defines an eighth unit area U8 as illustrated in FIG. 11. A single lower electrode Hn1 is completely located in the eighth unit area U8, and six lower electrodes 120 re partially located in the eighth unit area U8. Furthermore, the single lower electrode Hn1 is not exposed by any of the open regions Op. However, all six lower electrodes 120 partially located in the eighth unit area U8 are exposed by the open regions Op. Meanwhile, the sum of horizontal cross-cross sectional areas located in the eighth unit area U8, of these six lower electrodes 120, is equal to three times an entire horizontal cross-sectional area of one lower electrode 120.

Thus, the equivalent of four lower electrodes 120 are located in the eighth unit area U8, and only the equivalent of three lower electrodes 120 located in the eighth unit area U8 are exposed by the open region Op. Thus, the open ratio of the support 130g is 75%

Although, semiconductor devices whose supports have specific open rations have been described above, the inventive concept is not so limited. Rather, the open regions of the supports may be arrayed to provide open ratios different from the ones of the supports described above.

Figure 12B:
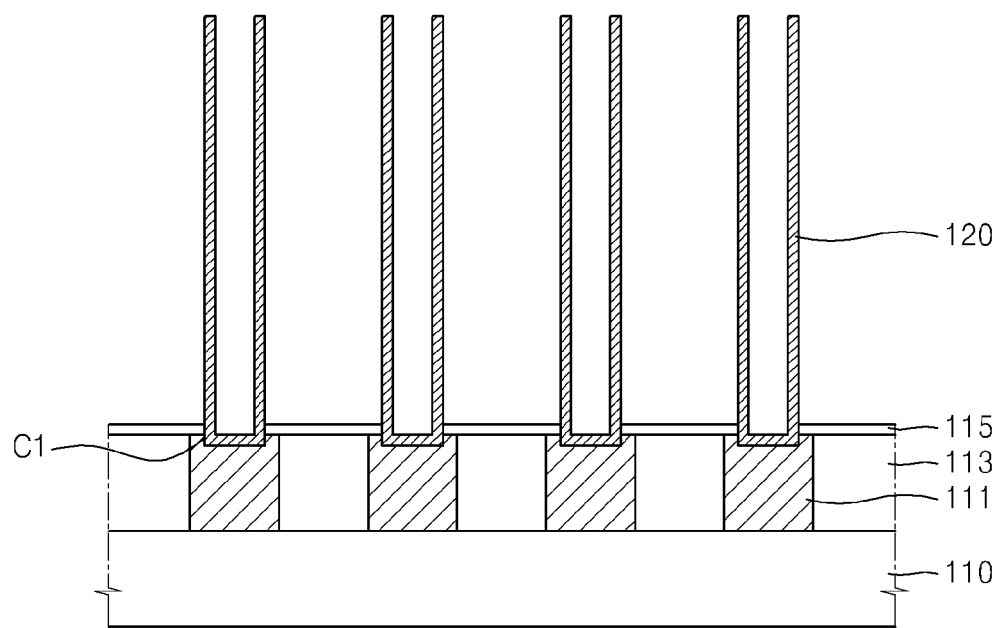
FIG. 12B is a cross-sectional view of the array of cylindrical structures of the semiconductor device according to the inventive concept, shown in FIG. 12A.

FIGS. 12A and 12B illustrate an embodiment of a semiconductor device having cylindrical structures according to the inventive concept.

Referring to FIGS. 12A and 12B, the semiconductor device may include a substrate 110 and an interlayer insulation layer 113. A plurality of contact plugs 111 may be buried in the interlayer insulation layer 113. A plurality of cylindrical lower electrodes 120 (i.e., a plurality of storage node electrode) may be disposed on the interlayer insulation layer 113. The lower electrodes 120 may be electrically connected to respective ones of the contact plugs 111. An etch stop layer 115 may be disposed on the interlayer insulation layer 113. In such a case, the lower electrodes 120 may penetrate the etch stop layer 115. The etch stop layer 115 may be formed of a silicon nitride (SiN) layer.

The substrate 110 may include a silicon substrate, a silicon-on-insulator (SOI) substrate, a silicon germanium (GeSi)

substrate, a gallium arsenide (GaAs) substrate, a ceramic substrate, a quartz substrate or a glass substrate such as those used for display panels. The substrate 110 may include various active elements and/or various passive elements constituting the semiconductor device. Accordingly, impurity regions for forming the active elements and/or the passive elements may be disposed in the substrate 110. The substrate 110 may further include contact pads (not shown). In this case, the contact pads may be disposed between the lower electrode 120 and the contact plugs 111.

Each of the contact plugs 111 may include a polysilicon layer or a metallic conductive layer, and top surfaces of the contact plugs 111 may be covered with a barrier metal layer such as a titanium (Ti) layer or a composite layer of titanium (Ti) topped with titanium nitride (TiN).

Each of the lower electrodes 120 may include one of a metal nitride layer, a metal layer and a combination thereof. For example, each of the lower electrodes 120 may include at least one of a titanium nitride (TiN) layer, a ruthenium (Ru) layer, a tantalum nitride (TaN) layer, a tungsten nitride (WN) layer, a platinum (Pt) layer and an iridium (Ir) layer. The lower electrodes 120 may have a high aspect ratio, as illustrated in FIGS. 12A and 12B. For example, each of the lower electrodes 120 may have an aspect ratio of about 10 to about 30. As examples of the dimensions of the lower electrodes 120, the width (outer diameter) of each lower electrode 120 may be within the range of about 20 nanometers to about 100 nanometers and the height of each lower electrode 120 may be within the range of about 500 nanometers to about 4000 nanometers. However, these are just examples and the width and the height of each lower electrode 120 are not limited to being within the aforementioned numerical ranges.

A top surface of each of the contact plugs 111 may have a recessed profile providing a groove C1. In such a case, bottom portions of the lower electrodes 120 may be disposed in respective ones of the grooves C1 of the contact plugs 111. Alternatively, each of the contact plugs 111 may have a flat top surface without any groove. In such a case, the lower electrodes 120 may be stacked on respective ones of the flat top surfaces of the contact plugs 111.

The semiconductor device includes a unitary support having open regions Op (any of the supports described with reference to FIGS. 1, 5, 6, 7, 8, 9, 10 and 11), and the unitary support may span the top end portions of the lower electrodes 120 to prevent the lower electrodes 120 from tilting after they have been fabricated.

Figure 13B:
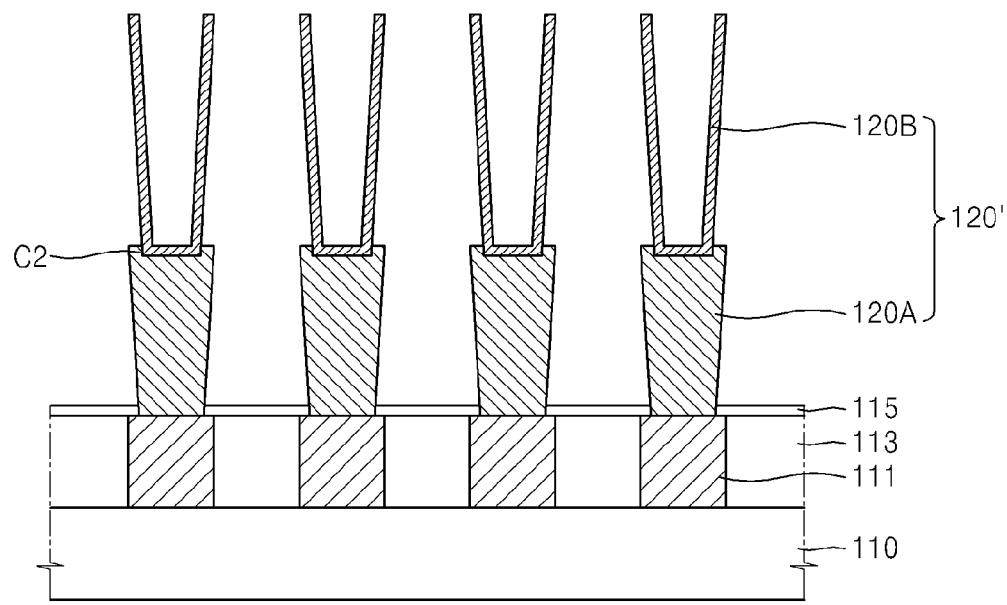
FIG. 13B is a cross-sectional view of the array of cylindrical structures of the semiconductor device according to the inventive concept, shown in FIG. 13A.

FIGS. 13A and 13B illustrate, in more detail, another embodiment of a semiconductor device having cylindrical structures according to the inventive concept. For the sake of brevity, elements which are similar to those of the embodiment of FIGS. 12A and 12B will not be or only briefly described again in detail.

Referring to FIGS. 13A and 13B, the semiconductor device has a plurality of lower electrode structures 120' stacked on the interlayer insulation layer 113 including the contact plugs 111. The lower electrode structures 120' may be electrically connected to respective ones of the contact plugs 111. Each of the lower electrode structures 120' includes a pillar-shaped lower electrode 120A, and a cylindrical lower electrode 120B stacked on the pillar-shaped lower electrode 120A. Bottom end portions of the pillar-shaped lower electrodes 120A may be supported by the etch stop layer 115, and the width of an upper part (or a top critical dimension) of each pillar-shaped lower electrode 120A may be greater than the width of a lower par (or a bottom critical dimension) of each cylindrical lower electrode 120B. Alternatively, the width of the upper part (or a top critical dimension) of each pillar-shaped lower electrode 120A may be less than or equal to the width of the lower part (or a bottom critical dimension) of each cylindrical lower electrode 120B.

A top surface of each of the pillar-shaped lower electrodes 120A may have a recessed profile providing a groove C2. In such a case, bottom portions of the cylindrical lower electrodes 120B may be disposed in respective ones of the grooves C2 of the pillar-shaped lower electrodes 120A. Alternatively, each of the pillar-shaped lower electrodes 120A may have a flat top surface without any groove. In such a case, the cylindrical lower electrodes 120B may be stacked on respective ones of the flat top surfaces of the pillar-shaped lower electrodes 120A. A height of the pillar-shaped lower electrodes 120A may be equal to or different from a height of the cylindrical lower electrodes 120B. In one example of this embodiment, the height of each of the lower electrodes 120A and 120B is within the range of about 200 nanometers to about 2000 nanometers. However, the height of each lower electrode 120A or 120B is not limited to falling within the aforementioned range.

Furthermore, each of the lower electrode structures 120' may include any one of a metal nitride layer, a metal layer and a combination thereof. For example, each of the lower electrodes 120A and 120B may include at least one of a titanium nitride (TiN) layer, a ruthenium (Ru) layer, a tantalum nitride (TaN) layer, a tungsten nitride (WN) layer, a platinum (Pt) layer and an iridium (Ir) layer.

If capacitors are formed using the lower electrode structures 120', a capacitance value of each of the capacitors including lower electrode structures 120' may be greater than a capacitance value of each of capacitors formed of pillar-shaped lower electrodes having the same height as the lower electrode structures 120'. Furthermore, if a capacitor is formed using the lower electrode structure 120' to obtain a predetermined capacitance value, a height of the lower electrode structures 120' may be less than the height of a pillar-shaped lower electrode of a capacitor having the same capacitance value as the predetermined capacitance value. Thus, advantage of the inventive concept in preventing lower electrodes from leaning is especially advantageous in connection with a semiconductor device having the lower electrode structures 120'.

FIG. 14 illustrates cylindrical structures and a support of a semiconductor device according to the inventive concept.

Referring to FIG. 14, the support 130 spans the lower electrodes 120. The support 130 may instead be any one of the supports 130a, 130b, 130c, 130d, 130e, 130f and 130g illustrated in FIGS. 5 to 11. Furthermore, the lower electrodes 120 may instead be the lower electrode structures 120' illustrated in FIG. 13A.

Advantages of the supports having the configurations described above, and which allow for high performance semiconductor devices to be realized, will become even more apparent with the description of the method of fabricating a semiconductor device fabricating a semiconductor device according to the inventive concept as illustrated in FIGS. 15A to 15F.

Figure 15A:
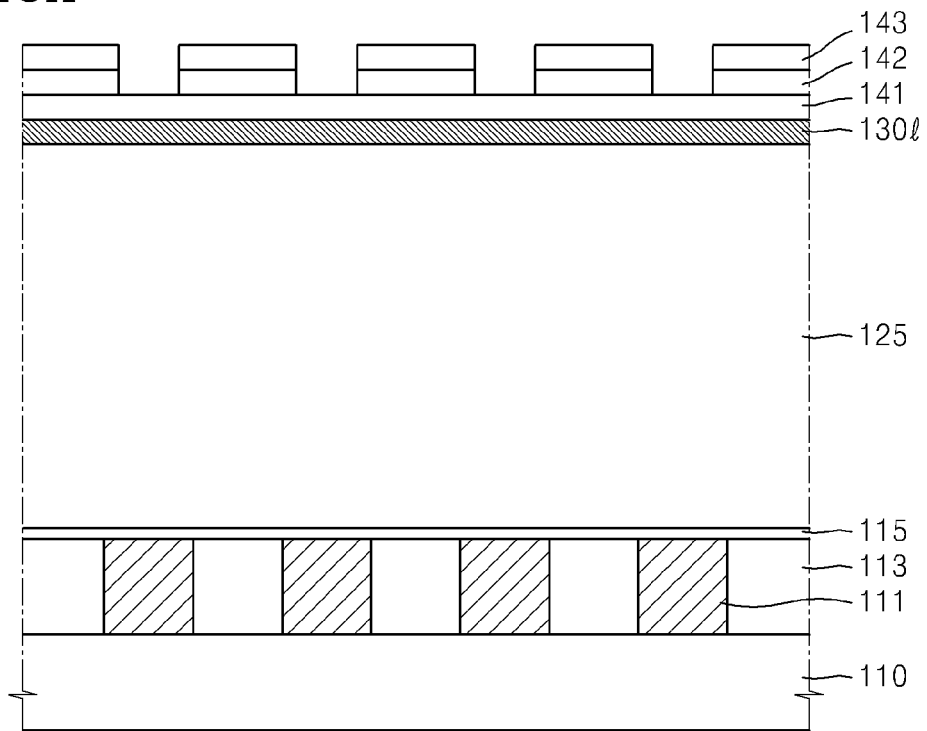
FIGS. 15A, 15B, 15C, 15D, 15E and 15F are cross-sectional views, taken in the direction of line I-I' of FIG. 14, illustrating a method of fabricating a semiconductor device including the cylindrical structures shown in FIGS. 12A and 12B.

Referring to FIG. 15A, an interlayer insulation layer 113 may be formed on a substrate 110, and a plurality of contact plugs 111 may be formed in the interlayer insulation layer 113. An etch stop layer 115 may then be formed on the interlayer insulation layer 113 and the contact plugs 111. A mold layer 125 may be formed on the etch stop layer 115. The mold layer 125 may include an oxide layer. For example, the mold layer 125 may be formed of a boro-phospho-silicate-glass (BPSG) layer, a spin-on-dielectric (SOD) layer, a phospho-silicate-glass (PSG) layer, a low pressure tetra-ethylortho-silicate (LPTEOS) layer or a plasma enhanced tetra-ethyl-ortho-silicate (PETEOS) layer. The mold layer 125 may be formed to a thickness of about 500 nanometers to about 4000 nanometers. However, the method is not limited to forming the mold layer 125 to such a thickness.

A support layer 1301 is formed on the mold layer 125. The support layer 1301 may be formed of an undoped polysilicon layer. The support layer 1301 may be formed to a thickness of about 20 nanometers to about 150 nanometers. However, the method is not limited to forming the support layer 1301 to a thickness falling within the aforementioned numerical range.

A first sacrificial layer 141 may be formed on the support layer 1301. The first sacrificial layer 141 may be formed of an oxide layer such as a TEOS layer, a BPSG layer, a PSG layer, an undoped silicate glass (USG) layer, an SOD layer or a high density plasma (HDP) oxide layer. The first sacrificial layer 141 may be formed to a thickness of about 50 nanometers to about 200 nanometers.

The first sacrificial layer 141 may be coated with photoresist material to form a photoresist layer, and the photoresist layer may be patterned using an exposure process and a development process to form a photoresist pattern 143. The photoresist pattern 143 may be formed to include a plurality of openings that define regions in which lower electrodes are formed in a subsequent process. Before forming the photoresist layer, a hard mask layer 142 such as an amorphous carbon layer or a polysilicon layer may be formed on the first sacrificial layer 141 and an anti-reflective coating (ARC) layer (not shown) may be formed on the hard mask layer 142.

The hard mask layer 142 may then be etched using the photoresist pattern 143 as an etch mask.

Figure 15B:
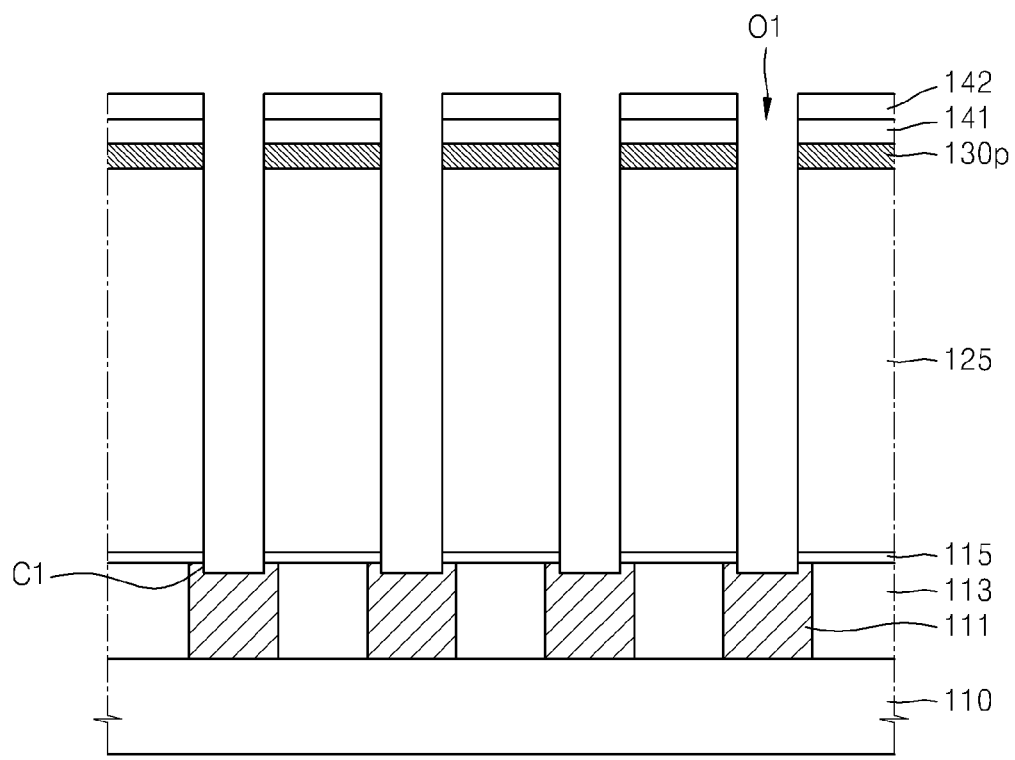

Referring to FIG. 15B, after removing the photoresist pattern 143, the first sacrificial layer 141, the support layer 1301, the mold layer 125 and the etch stop layer 115 may be etched using the hard mask layer 142 as an etch mask. As a result, a plurality of holes O1 may be formed in the mold layer 125, and top surfaces of the contact plugs 111 may be exposed by the holes O1. During formation of the holes O1, the support layer 1301 may be patterned to form a support pattern 130p.

In the event that the mold layer 125 is etched using a dry etch process, sides of the holes O1 may be formed to have a positive slope of about 89 degrees to about 89.9 degrees. That is, the holes O1 may be formed such that the width of the bottom of each hole O1 is less than the width of the top thereof. In the drawings, however, the holes O1 are illustrated to have vertical sidewalls for the purpose of ease and convenience in explanation. In some cases, when the holes O1 are formed, an over etch process may be applied to the contact plugs 111. As a result, top portions of the contact plugs 111 may be etched to provide grooves C1. Alternatively, the holes O1 may be formed without producing the grooves C1.

Figure 15C:
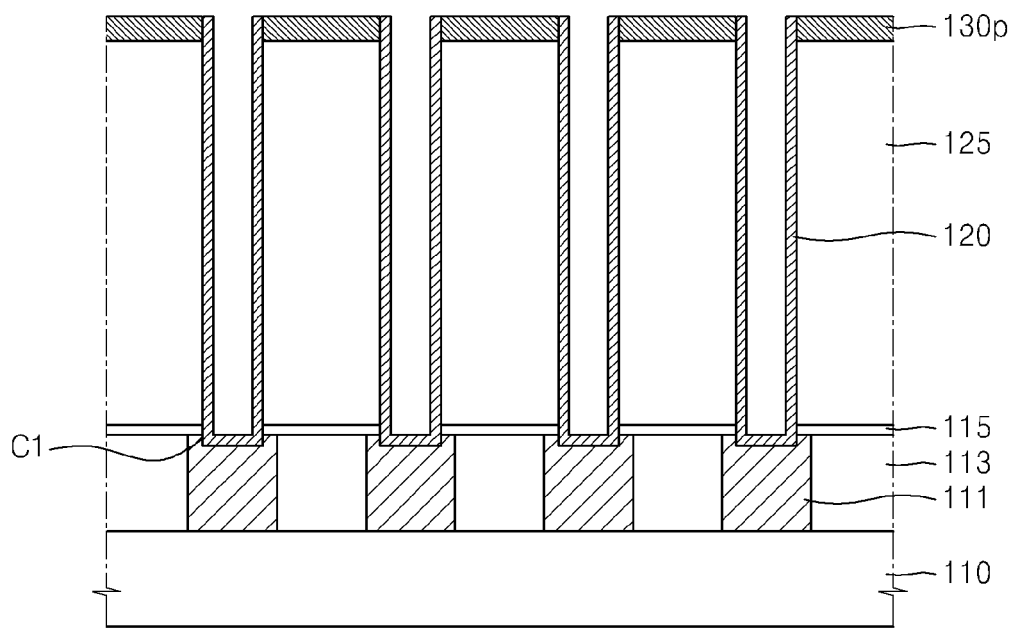

Referring to FIG. 15C, after removing the hard mask layer 142, a conductive layer may be formed on an entire surface of the resultant structure. The conductive layer may conform to the topography provided by the holes O1. Subsequently, a node separation process may be performed to form cylindrical lower electrodes 120 in respective ones of the holes O1. The conductive layer for forming the cylindrical lower electrodes 120 may be comprise any one of a metal nitride layer, a metal layer and a combination thereof. For example, the conductive layer may be formed of at least one of a titanium nitride (TiN) layer, a ruthenium (Ru) layer, a tantalum nitride (TaN) layer, a tungsten nitride (WN) layer, a platinum (Pt) layer and an iridium (Ir) layer. The conductive layer may be formed using a chemical vapor deposition (CVD) process or an atomic layer deposition (ALD) process and may be formed to a thickness of about 20 nanometers to about 100 nanometers.

The node separation process may be performed using a dry etch-back process or a chemical mechanical polishing (CMP) process until the support pattern 130p is exposed. The first sacrificial layer 141 may protect the support pattern 130p.

The cylindrical lower electrodes 120 may be insulated and separated from each other by the mold layer 125. In the event that the holes O1 are formed to have sloped sides, the cylindrical lower electrodes 120 are formed to have sloped sidewalls. That is, the cylindrical lower electrodes 120 may be formed such that the bottom of each lower electrode 120 is narrower than the top thereof. In the drawings, however, the cylindrical lower electrodes 120 are illustrated to have vertical sidewalls for the purpose of ease and convenience in explanation. The cylindrical lower electrodes 120 may be formed such that bottom portions of the cylindrical lower electrodes 120 are situated in respective ones of the grooves C1 provided on top surfaces of the contact plugs 111. Meanwhile, upper sidewalls of the cylindrical lower electrodes 120 are fixed and supported by the support pattern 130p.

Figure 15D:
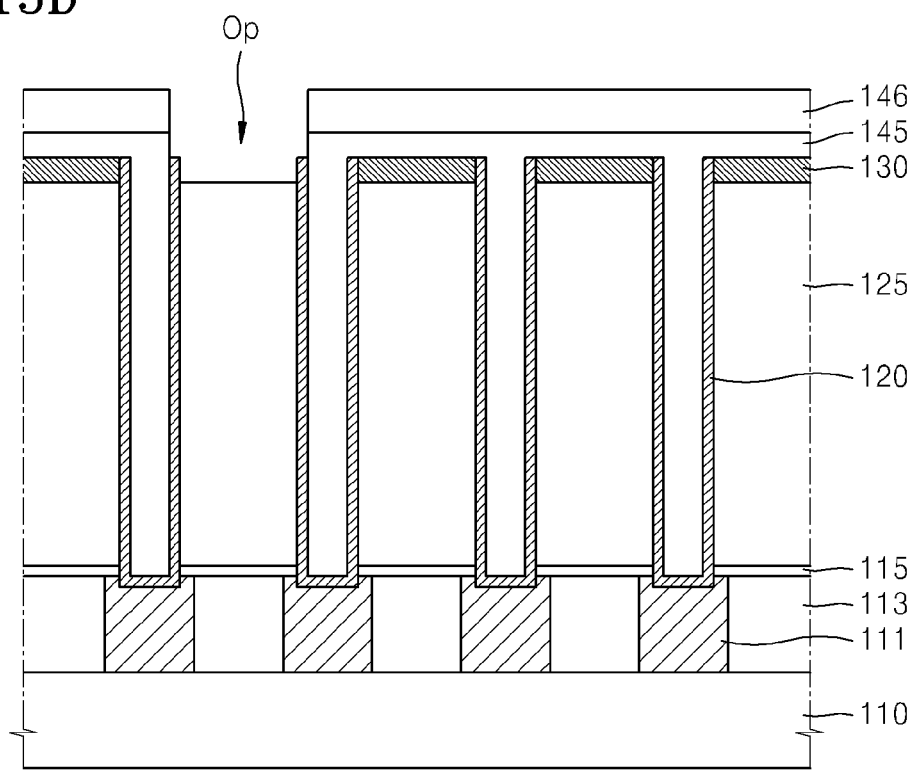

Referring to FIG. 15D, a second sacrificial layer 145, for example, an oxide layer may be formed on the lower electrodes 120 and the support pattern 130p. A photoresist pattern 146 may then be formed on the second sacrificial layer 145. The second sacrificial layer 145 may comprise an oxide layer such as a TEOS layer, a BPSG layer, a PSG layer, a USG layer, an SOD layer or an HDP oxide layer.

The second sacrificial layer 145 and the support pattern 130p may be successively etched using the photoresist pattern 146 as an etch mask, thereby forming a support 130 including open regions Op. The open regions Op expose portions of the cylindrical lower electrodes 120 and portions of the mold layer 125.

The open regions Op also provide paths through which wet etchant can be introduced into the mold layer in a subsequent wet etch process. The open regions Op of the support 130 may be formed to have any of the configurations of the open regions Op described with reference to FIG. 1, 4A, 4B, 4C, 5, 6, 7, 8, 9, 10 or 11. The support 130 including the open regions Op may be designed to facilitate the removal of the mold layer 125 in a subsequent wet etch process and to uniformly supply a source gas and a reaction gas onto the lower electrodes 120 in a subsequent deposition process for forming a dielectric layer. That is, the support 130 including the open regions Op may be designed to have a high open ratio such that the wet etch process for removing the mold layer 125 will be efficiently performed and the dielectric layer will be uniformly deposited on the lower electrodes 120 to exhibit excellent step coverage.

The open regions Op of the support 130 may be formed by etching the support pattern 130p, as described above. Thus, in this case, the performance of the support 130 may depend on the configuration of the array of the open regions Op and the shape of each open region Op. If the number of the open regions Op is too great or the area of each open region Op is too large, the support 130 may not be able to provide an adequate supporting function for the lower electrodes 120. In contrast, if there are too few open regions Op or the area of each open region Op is too small, the support 130 may impede a subsequent wet etch process for removing the mold layer 125 and may adversely affect a subsequent deposition process for forming a dielectric layer on the lower electrodes 120.

Moreover, if the size (i.e., area) of the open regions Op is too great, top portions of the lower electrodes 120 may be lost to cause a rabbit ear phenomenon during the etch process for forming the open regions Op. However, limiting the size of the open regions Op may make it difficult to provide a support 130 whose open ratio is high. Meanwhile, conventional supports employ a horizontal type of open region. However, in such a case, a minor axis of the horizontal type of open region is too short. For example, the horizontal type of open region is designed to have a minor axis whose length is about 2.6 times "F" and to expose six or more lower electrodes. Thus, there are limitations in reducing the size of the conventional horizontal type of open regions.

However, according to an aspect of the inventive concept, each of the open regions Op of the support 130 exposes only four lower electrodes 120. Thus, each of the open regions Op of the support 130 may be relatively small. In addition, the length of a minor axis of each open region Op may be comparatively greater than the length of a minor axis of the horizontal type of open region. Thus, it may be relatively easy to scale down the open regions Op of the support 130 in terms of a process margin. Moreover, the open regions Op may be readily formed using a quadrupole illumination system. Specifically, four poles generated by the quadrupole illumination system may correspond to four open regions Op. For the above reasons, a semiconductor device according to the inventive concept can effectively minimize or suppress the rabbit ear phenomenon.

Figure 15E:
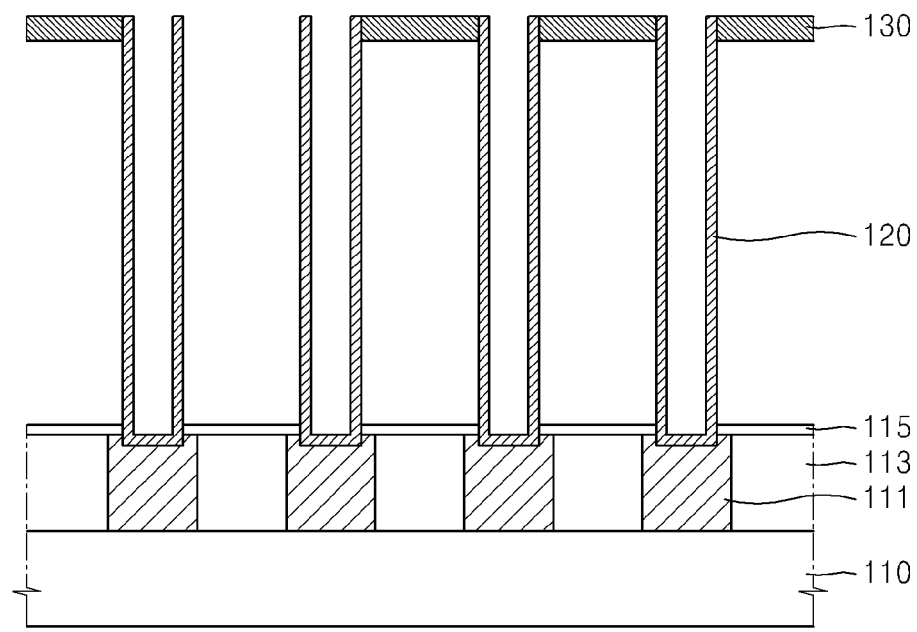

Referring to FIG. 15E, the mold layer 125 may be removed using a wet etch process. Since the mold layer 125 may be formed of an oxide layer, the wet etch process for removing the mold layer 125 may be performed using a wet chemical solution such as a hydrofluoric acid solution or a buffered oxide etchant (BOE). The wet chemical solution may be supplied through the open regions Op of the support 130 to etch the mold layer 125. While the mold layer 125 is etched and removed, the second sacrificial layer 145 may also be removed if formed of an oxide layer.

During the wet etch process for removing the mold layer 125, the support 130 is not etched. Thus, even while the mold layer 125 is removed, the support 130 still fixes and supports the cylindrical lower electrodes 120 such that the cylindrical lower electrodes 120 do not lean over. Furthermore, the etch stop layer 115 may prevent the wet chemical solution used in the wet etch process for removing the mold layer 125 from infiltrating into the interlayer insulation layer 113.

Figure 15F:
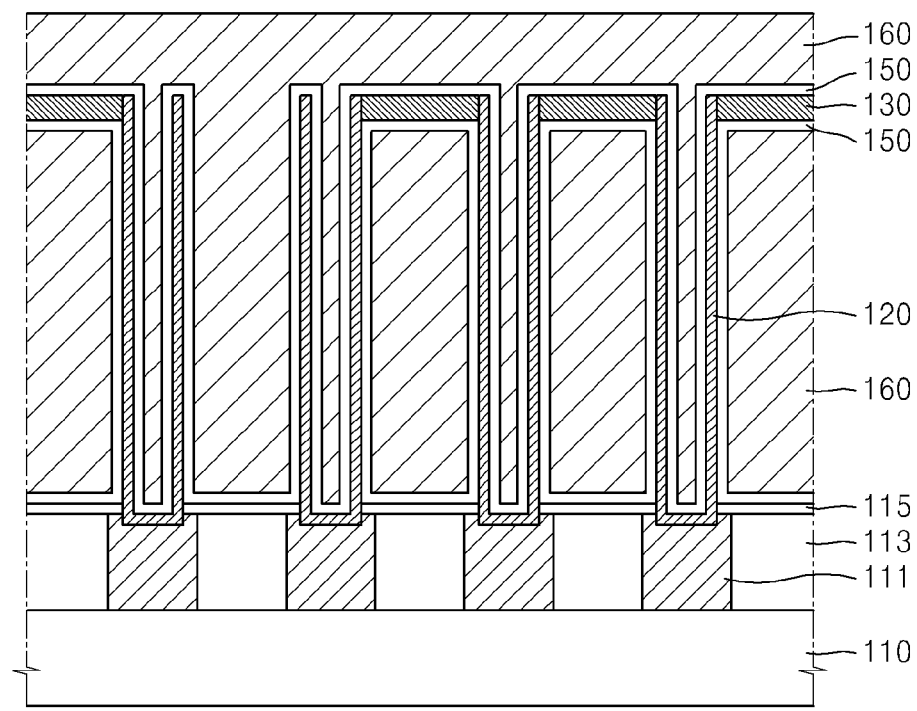

Referring to FIG. 15F, after removal of the mold layer 125, a dielectric layer 150 and a plate electrode 160 (i.e., an upper electrode) may be sequentially formed on the lower electrodes 120. Source gases and reaction gases may be supplied onto the lower electrodes 120 through the open regions Op during deposition processes for forming the dielectric layer 150 and the plate electrode 160. Thus, the dielectric layer 150 and the plate electrode 160 may be uniformly formed.

FIGS. 16A to 16F illustrate a method of fabricating a semiconductor device including the cylindrical structures shown in FIG. 13A. For the purpose of ease and convenience in explanation, steps similar to those described with reference to FIGS. 15A to 15F will be not be or only briefly described in detail again.

Figure 16A:
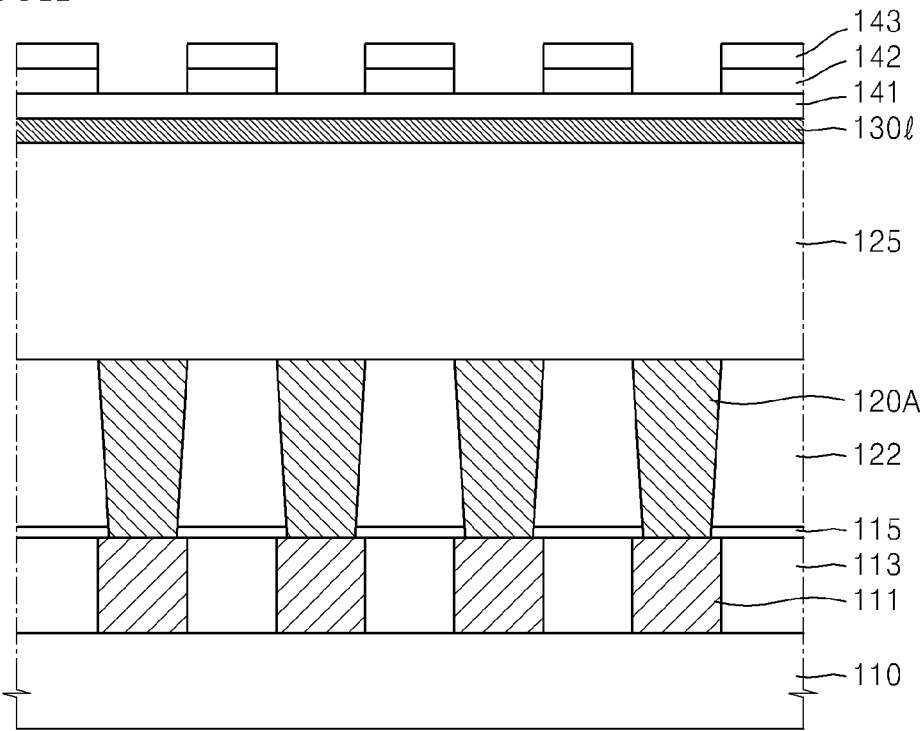
FIGS. 16A, 16B, 16C, 16D, 16E and 16F are cross-sectional views, taken in the direction of line I-I' of FIG. 14, illustrating a method of fabricating a semiconductor device including the cylindrical structures shown in FIG. 13A.

Referring to FIG. 16A, an interlayer insulation layer 113 may be formed on a substrate 110, and a plurality of contact plugs 111 may be formed in the interlayer insulation layer 113. An etch stop layer 115 may then be formed on the interlayer insulation layer 113 and the contact plugs 111. A first mold layer 122 may be formed on the etch stop layer 115. The first mold layer 122 may be formed to include an oxide layer, and a thickness of the first mold layer 122 may be determined in consideration of a capacitance value of capacitors to be formed in subsequent processes. The first mold layer 122 may be formed of an oxide layer such as a BPSG layer, an SOD layer, a PSG layer, an LPTEOS layer or a PETEOS layer. In some cases, the first mold layer 122 may be formed to a thickness of about 200 nanometers to about 2000 nanometers.

The first mold layer 122 may be planarized using a planarization process. Subsequently, a plurality of pillar-shaped lower electrodes 120A may be formed in the first mold layer 122 using similar methods as described with reference to FIGS. 15A and 15B. The pillar-shaped lower electrodes 120A may be formed such that the bottom of each pillar-shaped lower electrode 120A is narrower than the top thereof. The pillar-shaped lower electrodes 120A may be formed to include any one of a metal nitride layer, a metal layer and a combination thereof. For example, the pillar-shaped lower electrodes 120A may be formed to include at least one of a titanium nitride (TiN) layer, a ruthenium (Ru) layer, a tantalum nitride (TaN) layer, a tungsten nitride (WN) layer, a platinum (Pt) layer and an iridium (Ir) layer.

Subsequently, a second mold layer 125 may be formed on the first mold layer 122 and the pillar-shaped lower electrodes 120A, and a support layer 1301 may be formed on the second mold layer 125. The second mold layer 125 may be formed to a thickness of about 200 nanometers to about 2000 nanometers. The second mold layer 125 may be formed of the same material as the mold layer 125 illustrated in FIG. 15A. The second mold layer 125 may be formed to the same thickness as the first mold layer 122. Alternatively, the second mold layer 125 may be formed to a thickness different from that of the first mold layer 122.

The support layer 1301 may be formed to have the same thickness as described with reference to FIG. 15A. Furthermore, the support layer 1301 may be formed of the same material as described with reference to FIG. 15A. A first sacrificial layer 141, a hard mask layer 142 and a photoresist pattern 143 may be sequentially formed on the support layer 1301. The hard mask layer 142 may then be etched using the photoresist pattern 143 as an etch mask.

Figure 16B:
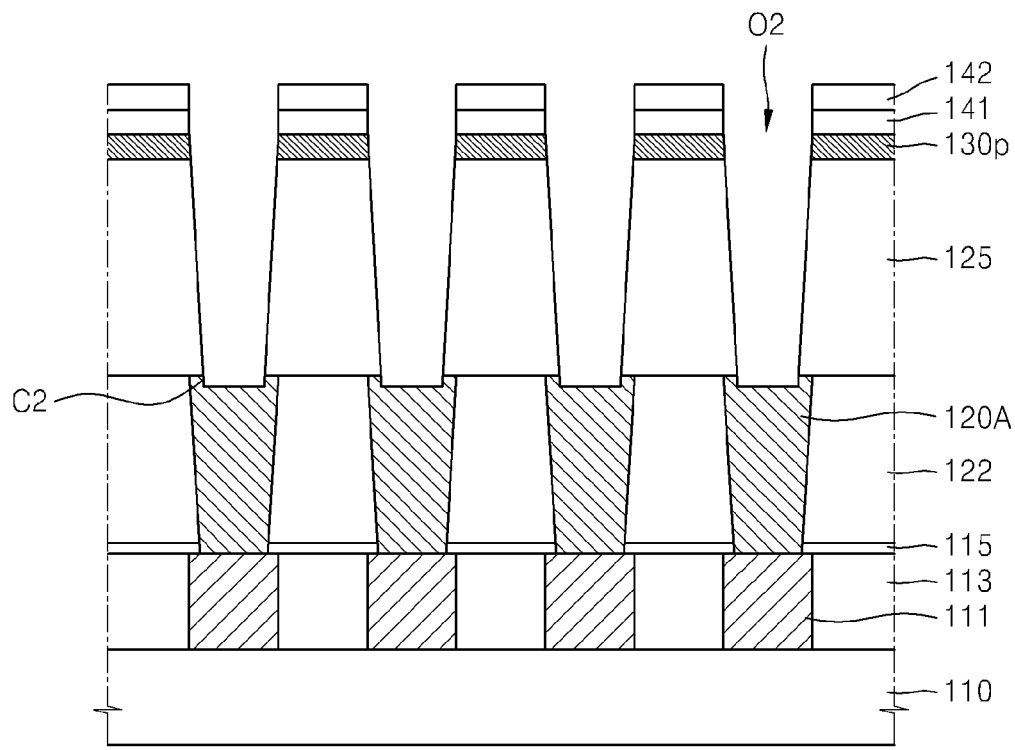

Referring to FIG. 16B, after removing the photoresist pattern 143, the first sacrificial layer 141, the support layer 1301 and the second mold layer 125 may be etched using the hard mask layer 142 as an etch mask. As a result, a plurality of holes O2 may be formed in the second mold layer 125, and top surfaces of the pillar-shaped lower electrodes 120A may be exposed by the holes 02. As illustrated in FIG. 16B, when the holes O2 are formed, the pillar-shaped lower electrodes 120A may be subjected to an over etch process. As a result, top portions of the pillar-shaped lower electrodes 120A may be etched to provide grooves C2.

Figure 16C:
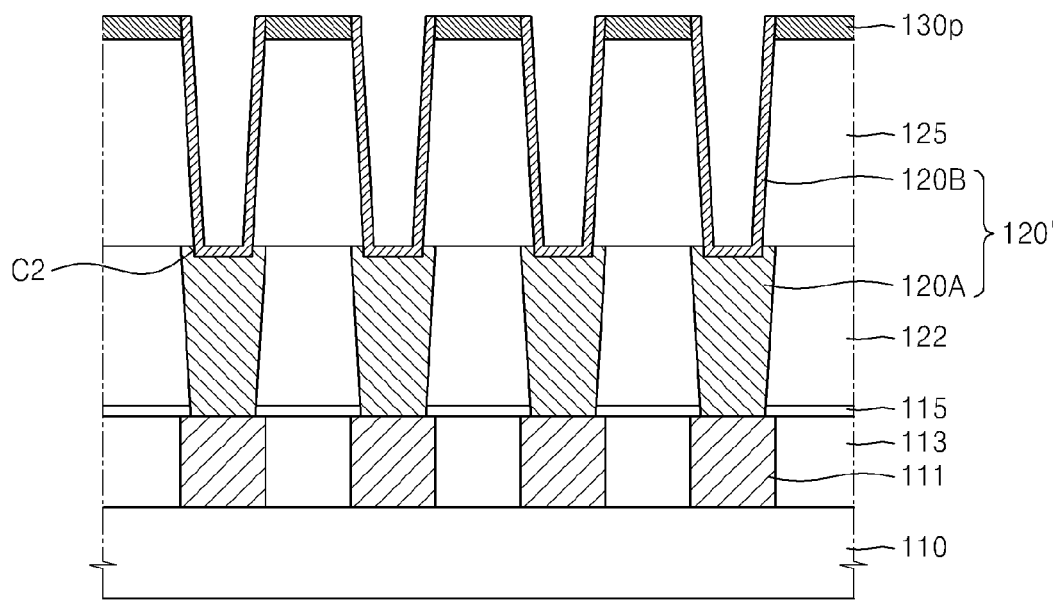

Referring to FIG. 16C, after removing the hard mask layer 142, a conductive layer may be formed on an entire surface of the resultant structure. The conductive layer may be conformally formed in the structure having the holes O2. Subsequently, a node separation process may be performed to form cylindrical lower electrodes 120B in respective ones of the holes O2. The cylindrical lower electrodes 120B may be formed using the same method as described with reference to FIG. 15C. As illustrated in the drawings, the holes O2 may be formed to have sloped sides such that the bottom of each hole O2 is narrower than the top thereof. Thus, the cylindrical lower electrodes 120B may also be formed such that the bottom of each cylindrical lower electrode 120B is narrower than the top width thereof. Alternatively, the holes O2 may be formed to have vertical sides, as illustrated in FIG. 15C. In such a case, the cylindrical lower electrodes 120B are formed to have vertical sidewalls.

Figure 16D:
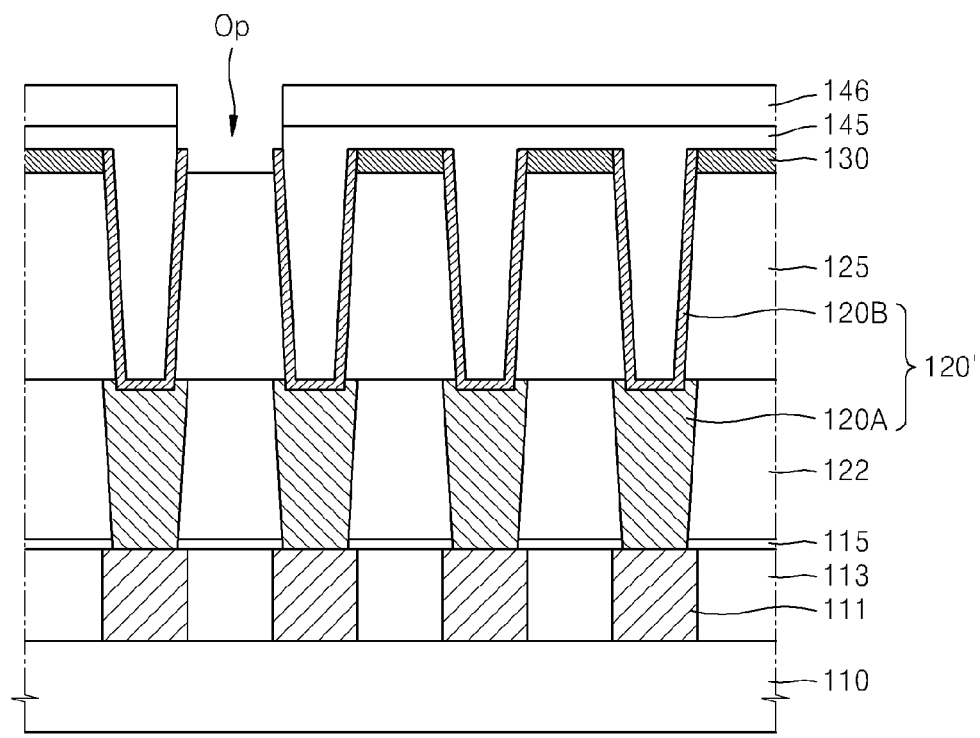

The cylindrical lower electrodes 120B may be formed such that bottom portions of the cylindrical lower electrodes 120B are situated in respective ones of the grooves C2 provided on top surfaces of the pillar-shaped lower electrodes 120A. Thus, the pillar-shaped lower electrodes 120A and the cylindrical lower electrodes 120B may be stably and strongly integrated with each other. The pillar-shaped lower electrodes 120A and the cylindrical lower electrodes 120B may constitute lower electrode structures 120'. Upper sidewalls of the cylindrical lower electrodes 120B may be fixed and supported by the support pattern 130p. Referring to FIG. 16D, a second sacrificial layer 145 and a photoresist pattern 146 may be sequentially formed on the cylindrical lower electrodes 120B and the support pattern 130p. The second sacrificial layer 145 and the support pattern 130p may be successively etched using the photoresist pattern 146 as an etch mask, thereby forming a support 130 including open regions Op. The open regions Op may be formed to expose portions of the cylindrical lower electrodes 120B and portions of the second mold layer 125. The open regions Op of the support 130 may be formed to have the same configuration as the open regions Op of any of the supports described with reference to FIG. 1, 4A, 4B, 4C, 5, 6, 7, 8, 9, 10 or 11.

Accordingly, the support 130 including the open regions Op may have a high open ratio such that a wet etch process for removing the mold layer 125 is efficiently performed and a dielectric layer is uniformly deposited on the lower electrode structures 120' to exhibit excellent step coverage. Furthermore, each of the open regions Op of the support 130 is formed to expose four lower electrode structures 120'. Thus, each of the open regions Op of the support 130 may be relatively small. In addition, the length of a minor axis of each open region Op may be comparatively greater than the length of a minor axis of the horizontal type open region. Thus, it may be easy to scale down the open regions Op of the support 130 in terms of a process margin. Moreover, a quadrupole illumination system may be used to form the open regions Op in consideration of the array of the open regions Op. For the above reasons, a semiconductor device according to the inventive concept may effectively minimize or suppress the rabbit ear phenomenon.

Figure 16E:
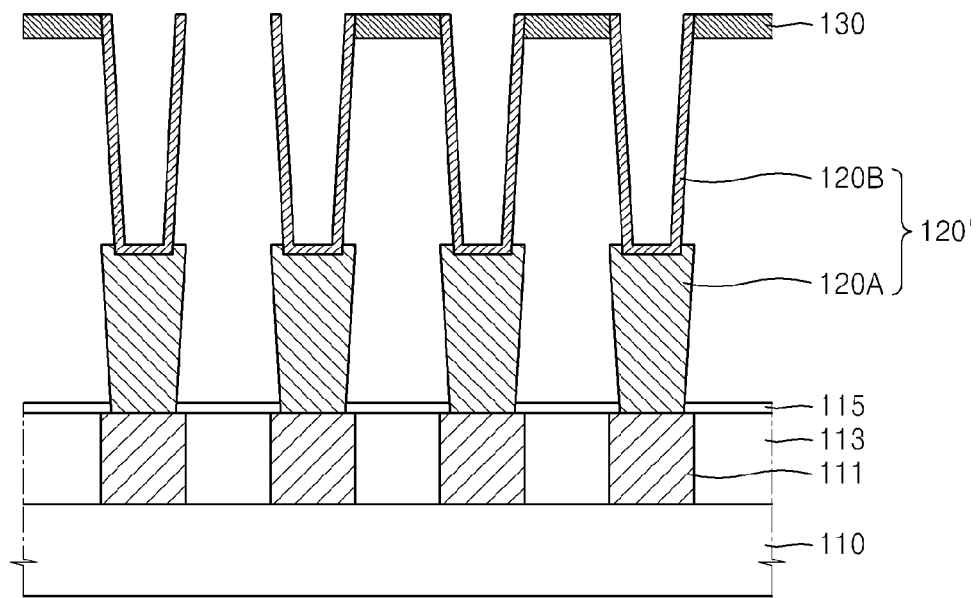

Referring to FIG. 16E, the first and second mold layers 122 and 125 may be removed using a wet etch process. Since both the first and second mold layers 122 and 125 may be formed of an oxide layer, the first and second mold layers 122 and 125 may be simultaneously removed using a wet chemical solution such as a hydrofluoric acid solution or a buffered oxide etchant (BOE). While the first and second mold layers 122 and 125 are etched and removed, the second sacrificial layer 145 may also be removed if the second sacrificial layer 145 is formed of an oxide layer.

During the wet etch process for removing the first and second mold layers 122 and 125, the support 130 is not etched. Thus, even while the first and second mold layers 122 and 125 are removed, the support 130 will still fix and support the cylindrical lower electrodes 120B such that the cylindrical lower electrodes 120B do not lean over. In addition, since the lower electrode structures 120' are composed of the pillar-shaped lower electrodes 120A and the cylindrical lower electrodes 120B stacked on the pillar-shaped lower electrodes 120A, the lower electrode structures 120' may also be fixed and supported by the support 130 during the wet etch process for removing the first and second mold layers 122 and 125. Furthermore, the etch stop layer 115 may prevent the wet chemical solution used in the wet etch process for removing the first and second mold layers 122 and 125 from infiltrating into the interlayer insulation layer 113 during the wet etch process.

Figure 16F:
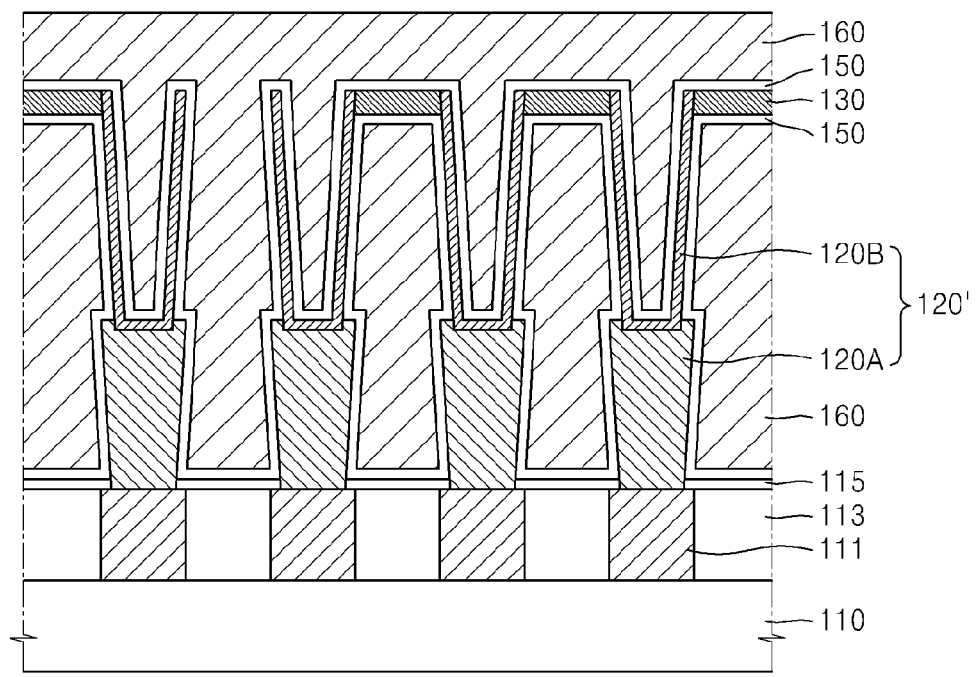

Referring to FIG. 16F, after removal of the first and second mold layers 122 and 125, a dielectric layer 150 and a plate electrode 160 (i.e., an upper electrode) may be sequentially formed on the exposed lower electrode structures 120'. Source gases and reaction gases may be supplied onto the lower electrode structures 120' through the open regions Op during deposition processes for forming the dielectric layer 150 and the plate electrode 160. Thus, the dielectric layer 150 and the plate electrode 160 may be uniformly formed.

Figure 17:
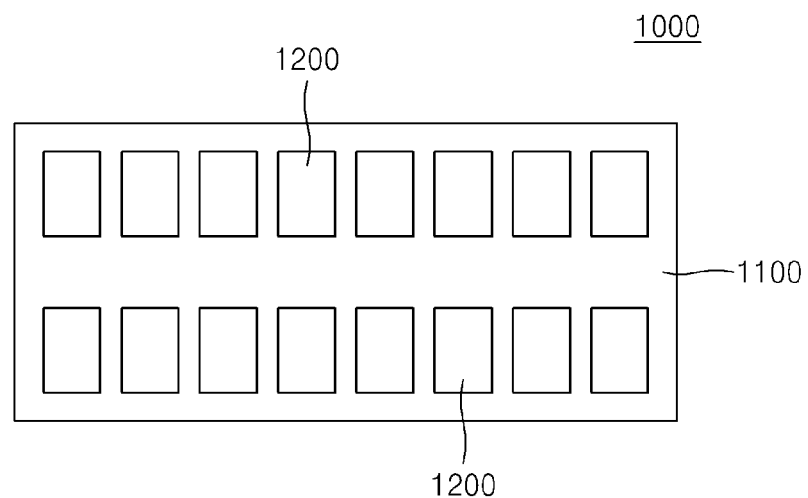
FIG. 17 is a plan view of a memory module including a semiconductor device according to the inventive concept.

FIG. 17 illustrates a memory module including a semiconductor device according to the inventive concept.

Referring to FIG. 17, the memory module 1000 may include a printed circuit board (PCB) 1100 and a plurality of semiconductor packages 1200 mounted on the PCB 1100.

The plurality of semiconductor packages 1200 may include any of the above-described embodiments of semiconductor devices according to the inventive concept. In particular, the plurality of semiconductor packages 1200 may include at least one semiconductor device according to the inventive concept.

The memory module 1000 according to the inventive concept may be a single in-lined memory module (SIMM) including the plurality of semiconductor packages 1200 mounted on a single surface of the PCB 1100 or a dual in-lined memory module (DIMM) including the plurality of semiconductor packages 1200 mounted on both surfaces of the PCB 1100. Furthermore, the memory module 1000 according to the inventive concept may be a fully buffered dual in-lined memory module (FBDIMM) having an advanced memory buffer (AMB) that applies external signals to the plurality of semiconductor packages 1200.

Figure 18:
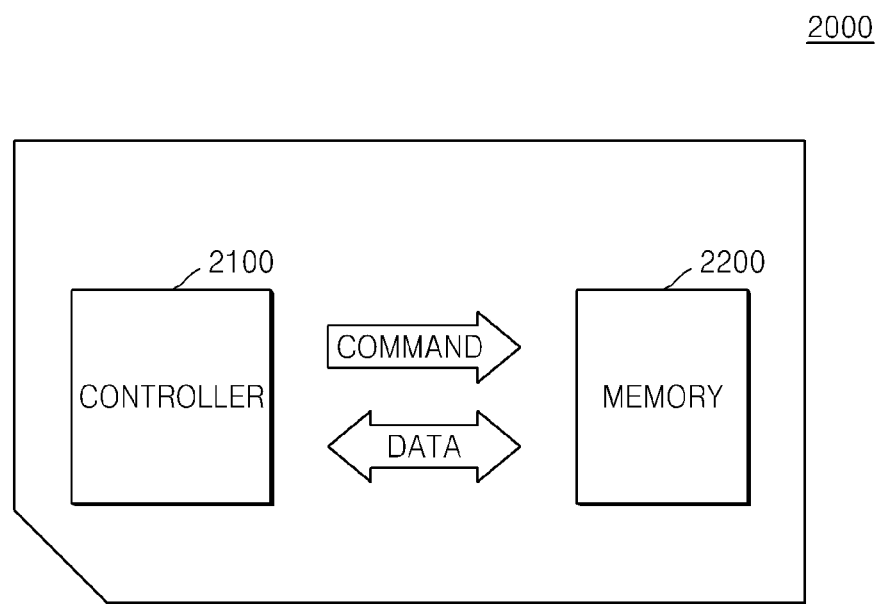
FIG. 18 is a schematic view illustrating a memory card including a semiconductor device according the inventive concept.

FIG. 18 illustrates a memory card including a semiconductor device according to the inventive concept.

Referring to FIG. 18, the memory card 2000 may include a controller 2100 and a memory 2200 that communicate with each other using electrical signals. For example, if the controller 2100 sends a command to the memory 2200, the memory 2200 may send data to the controller 2100 or may receive data from the controller 2100.

The memory 2200 may include at least one embodiment of a semiconductor device according to the inventive concept.

The memory card 2000 may be any one of various types of memory cards. For example, the memory card 2000 may be a memory stick card, a smart media (SM) card, a secure digital (SD) card, a mini-secure digital card, or a multimedia card (MMC).

Figure 19:
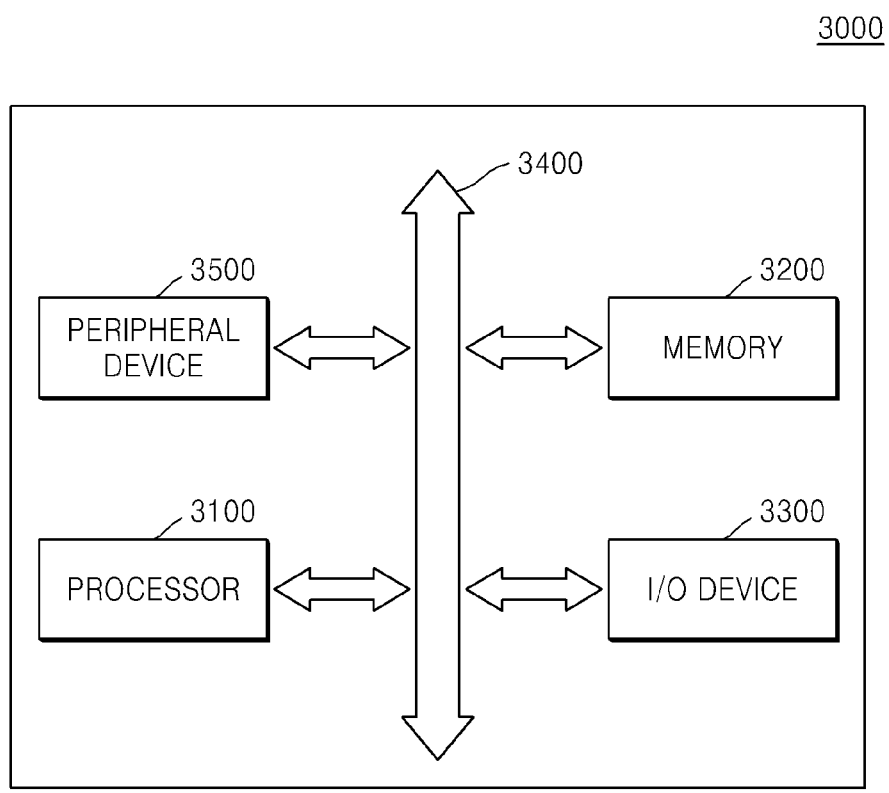
FIG. 19 is a schematic view illustrating a system including a semiconductor device according to the inventive concept.

FIG. 19 illustrates a system including a semiconductor device according to the inventive concept.

Referring to FIG. 19, the system 3000 may include a processor 3100, a memory 3200 and an input/output (I/O) device 3300 that communicate with each other though a bus 3400.

The memory 3200 of the system 3000 may include a random access memory (RAM) device and a read only memory (ROM) device. The system 3000 may further include a peripheral device 3500 such as a floppy disk driver and/or a compact disk (CD) ROM driver.

The memory 3200 may include at least one semiconductor device according to the inventive concept.

The memory 3200 may store codes and data for operation of the processor 3100 therein. The system 3000 may be employed by mobile phones, MP3 players, navigators, portable multimedia players (PMPs), solid state drives (SSDs) or household appliances.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A semiconductor device comprising:
a two-dimensional horizontal array of cylindrical structures, the cylindrical structures being disposed at vertices and central points of a plurality of hexagons, respectively, wherein the hexagons have the pattern of a honeycomb; and
a contiguous support spanning the cylindrical structures horizontally so as to support the cylindrical structures, the support having a two-dimensional horizontal array of openings therethrough, each of the openings exposing respective parts each of four of the cylindrical structures,
wherein the plurality of hexagons, having the pattern of a honeycomb, include first to seventh hexagons,
wherein six vertices of the first hexagon coincide with respective ones of six central points of the second to seventh hexagons, and the central point of the first hexagon coincides with one vertex of each of the second to seventh hexagons,
wherein the shape of each of the openings as viewed from above is substantially that of a parallelogram or an oval, and
wherein the four cylindrical structures exposed by each of the openings include a first pair of the four cylindrical structures disposed opposite one another across the opening and a second pair of the four cylindrical structures disposed opposite one another across the opening, the cylindrical structures of the first pair are spaced from one another by a first distance, the cylindrical structures of the second pair are spaced from one another by a second distance, the first distance is shorter than the second distance, and the first distance is equal to the distances between the central point of each hexagon and the vertices of that hexagon.

2. The semiconductor device of claim 1, wherein the openings expose respective parts of all the cylindrical structures.

3. The semiconductor device of claim 2, wherein a straight line connecting the cylindrical structures of said second pair thereof and another straight line parallel with the first direction intersect at an acute angle.

4. The semiconductor device of claim 2, wherein the cylindrical structures include a plurality of rows of the cylindrical structures each of which rows extends in a direction parallel to a first direction, and a plurality of columns of the cylindrical structures each of which columns extends in a direction parallel to a second direction, and
wherein a straight line connecting the cylindrical structures of said second pair thereof is parallel with the second direction.

5. The semiconductor device of claim 2,
wherein the cylindrical structures include a plurality of rows of the cylindrical structures each of which rows extends in a direction parallel to a first direction, and a plurality of columns of the cylindrical structures each of which columns extends in a direction parallel to a second direction,
wherein the openings include a plurality of rows of the openings parallel with the first direction or a plurality of columns of the openings parallel with the second direction, and
wherein straight lines connecting the cylindrical structures of the second pairs thereof, respectively, are parallel, or straight lines connecting the cylindrical structures of the second pairs thereof, respectively, in two adjacent ones of the rows of the cylindrical structures are not parallel with each other, or straight lines connecting the cylindrical structures of the second pairs thereof, respectively, in two adjacent ones of the columns of the cylindrical structures are not parallel with each other.

6. The semiconductor device of claim 2, wherein the cylindrical structures include a plurality of rows of the cylindrical structures each of which rows extends in a direction parallel to a first direction, and a plurality of columns of the cylindrical structures each of which columns extends in a direction parallel to a second direction,
wherein the openings include a plurality of rows of the openings each parallel with the first direction and a plurality of columns of the openings each parallel with the second direction, and
wherein the openings in two adjacent ones of the rows thereof are disposed in a zigzag fashion along the first direction when viewed from above.

7. The semiconductor device of claim 1,
wherein an area of a parallelogram whose vertices coincide with four central points of four adjacent ones of the openings, respectively, is a unit area of the support, and
wherein two of the cylindrical structures are located entirely within the unit area and are not exposed by any of the openings whose central points coincide with the vertices of the parallelogram.

8. The semiconductor device of claim 7, wherein the cylindrical structures include a plurality of rows of the cylindrical structures each of which rows extends in a direction parallel to a first direction, and a plurality of columns of the cylindrical structures each of which columns extends in a direction parallel to a second direction, and
wherein a straight line connecting the cylindrical structures of the second pair thereof and another straight line parallel with the first direction intersect at an acute angle, or a straight line a straight line connecting the cylindrical structures of the second pair thereof is parallel with the second direction.

9. The semiconductor device of claim 1,
wherein an area of a parallelogram whose vertices coincide with four central points of four adjacent ones of the openings, respectively, is a unit area of the support, and
wherein one of the cylindrical structures is located entirely within the unit area and is not exposed by any of the openings whose central points coincide with the vertices of the parallelogram.

10. The semiconductor device of claim 9, wherein the cylindrical structures include a plurality of rows of the cylindrical structures each of which rows extends in a direction parallel to a first direction, and a plurality of columns of the cylindrical structures each of which columns extends in a direction parallel to a second direction, and
wherein a straight line between the cylindrical structures of the second pair thereof and another straight line parallel with the first direction intersect at an acute angle.

11. The semiconductor device of claim 1, wherein the shape of each of the openings, as viewed from above, is substantially that of a diamond, and four adjacent ones of the cylindrical structures are respectively located at the four vertices of each of the substantially diamond-shaped openings.

12. The semiconductor device of claim 1, wherein each of the openings exposes a portion of each of only four adjacent ones of the cylindrical structures.

13. The semiconductor device of claim 1,
wherein the cylindrical structures include a plurality of rows of the cylindrical structures each of which rows extends in a direction parallel to a first direction, and a plurality of columns of the cylindrical structures each of which columns extends in a direction parallel to a second direction,
wherein the openings include a plurality of rows of the openings each parallel with the first direction and a plurality of columns of the openings each parallel with the second direction, and
when the first distance is equal to three times "F", the pitch of the openings in the first direction is equal to 6.0 times "F" and the pitch of the openings in the second direction is equal to 5.2 times "F".

14. The semiconductor device of claim 1, further comprising a plurality of pillar-shaped electrodes disposed under respective ones of the cylindrical structures.

15. A semiconductor device comprising:
a plurality of cylindrical structures disposed at vertices and central points of a plurality of regular hexagons in the pattern of a honeycomb, the plurality of regular hexagons including first to seventh regular hexagons, the six vertices of the first regular hexagon coinciding with six central points of the second to seventh regular hexagons, respectively, and a central point of the first regular hexagon coinciding with a respective one of the vertices of each of the second to seventh regular hexagons; and
a contiguous support spanning the cylindrical structures horizontally to support the cylindrical structures and having a plurality of openings extending vertically therethrough, the shape of each of the openings as viewed from above is substantially that of a parallelogram or an oval, and each of the openings exposing respective parts each of only four of the cylindrical structures,
wherein the support has an open ratio of about 65% or higher, and
the open ratio of the unitary support is the ratio of an equivalent number of entire ones of the cylindrical structures exposed by the open regions in a unit area to an equivalent number of entire ones of the cylindrical structures located in the unit area, and the unit area is the area of a tetragon whose four vertices each coincide with a central point of a respective one of four adjacent ones of the openings.

16. A semiconductor device comprising:
a substrate;
a horizontal array of cylindrical structures each extending vertically on the substrate,
the horizontal array of cylindrical structures consisting of a plurality of columns of cylindrical structures, and a plurality of rows of cylindrical structures each crossing a plurality of the columns of the cylindrical structures, the cylindrical structures in each row thereof being spaced uniformly apart from one another, the cylindrical structures in each column thereof being spaced uniformly apart from one another, and the cylindrical structures being disposed at vertices and geometrical centers of a plurality of regular hexagons, respectively, and wherein the hexagons have the pattern of a honeycomb; and
a support disposed above the substrate and contiguous with at least a part of each of the cylindrical structures so as to support the cylindrical structures, the support having a horizontal array of openings comprising a plurality of columns of openings, and a plurality of rows of openings each crossing a plurality of the columns of the openings, the openings in each row thereof being spaced uniformly apart from one another, the openings in each column thereof being spaced uniformly apart from one another, each of the openings extending vertically through the support, and
wherein part of each of the openings intersects only four of the cylindrical structures and at respective sides thereof,
wherein the plurality of hexagons include first to seventh hexagons,
wherein six vertices of the first hexagon coincide with the geometrical centers of the second to seventh hexagons, respectively, and the geometrical center of the first hexagon coincides with one vertex of each of the second to seventh hexagons.

17. The semiconductor device of claim 16, wherein the support contacts the cylindrical structures along upper parts of sides thereof, respectively.

18. The semiconductor device of claim 16, wherein part of each of the openings coincides with a parallelogram or oval lying in a horizontal plane.

19. The semiconductor device of claim 16, wherein the support contacts each cylindrical structure, disposed at the geometrical center of one of the hexagons, along the entire circumference of one part of the side of the cylindrical structure.

20. The semiconductor device of claim 16, wherein the four cylindrical structures intersected by each opening are all different from the four cylindrical structures intersected by each of the other openings.

* * * * *